(12) United States Patent
Lee et al.

(10) Patent No.: US 11,024,642 B2
(45) Date of Patent: Jun. 1, 2021

(54) VERTICAL MEMORY DEVICE

(71) Applicant: SAMSUNG ELECTRONICS CO., LTD., Suwon-si (KR)

(72) Inventors: Kyung Hwan Lee, Hwaseong-si (KR); Yong Seok Kim, Suwon-si (KR); Jun Hee Lim, Seoul (KR); Kohji Kanamori, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 32 days.

(21) Appl. No.: 16/508,727

(22) Filed: Jul. 11, 2019

(65) Prior Publication Data

US 2020/0203369 A1 Jun. 25, 2020

(30) Foreign Application Priority Data

Dec. 19, 2018 (KR) .................. 10-2018-0165352

(51) Int. Cl.
  *H01L 27/11582* (2017.01)
(52) U.S. Cl.
  CPC .............................. *H01L 27/11582* (2013.01)
(58) Field of Classification Search
  None
  See application file for complete search history.

(56) References Cited

U.S. PATENT DOCUMENTS

| 8,072,025 B2 | 12/2011 | Nishihara et al. |
| 8,120,089 B2 | 2/2012 | Kim et al. |
| 9,881,931 B2 | 1/2018 | Lee |
| 9,978,771 B2 | 5/2018 | Hwang |
| 10,411,033 B2 * | 9/2019 | Kim .................. H01L 29/7827 |
| 2017/0040061 A1 | 2/2017 | Yeh et al. |
| 2017/0243945 A1 | 8/2017 | Sekine et al. |
| 2018/0025783 A1 * | 1/2018 | Choi .................. G11C 16/34 |
| | | 365/185.23 |
| 2018/0083028 A1 | 3/2018 | Fukumoto et al. |
| 2018/0138195 A1 | 5/2018 | Lee |
| 2018/0175051 A1 | 6/2018 | Lue et al. |
| 2018/0226427 A1 | 8/2018 | Huang et al. |
| 2020/0203329 A1 * | 6/2020 | Kanamori ......... H01L 27/11582 |

OTHER PUBLICATIONS

Sheng-Chih Lai, et. al. "A Bottom-Source Single-Gate Vertical Channel (BS-SGVC) 3D NAND Flash Architecture and Studies of Bottom Source Engineering", IMW 2016.

Chia-Jung Chiu, et. al. "A Novel Double-density Single-gate Vertical-channel (SGV C) 3D NAND Flash Utlizing a Flat-Channel Thin-Body Device", IEEE 2016.

(Continued)

*Primary Examiner* — Hsien Ming Lee

(74) *Attorney, Agent, or Firm* — F. Chau & Associates, LLC

(57) ABSTRACT

A vertical memory device includes a stacked structure including a plurality of gate electrode layers stacked on a substrate, a plurality of channel layers extending in a direction perpendicular to an upper surface of the substrate on a first side surface of the stacked structure and spaced apart from each other in a direction parallel to the upper surface of the substrate, and a common source layer disposed between the stacked structure and the substrate and contacting the channel layers.

13 Claims, 21 Drawing Sheets

(56) References Cited

OTHER PUBLICATIONS

Hang-Ting Lue, et. al. "A Novel Double-density, Single-Gate Vertical Channel (SGVC) 3D NAND Flash That Is Tolerant to Deep Vertical Etching CD Variation and Possesses Robust Read-disturb Immunity", IEEE 2015.
Chen-Jun Wu, et. al. "Device Characteristics of Single-Gate Vertical Channel (SGVC) 3D NAND Flash Architecture", IEEE 2016.
Hang-Ting Lue, et. al. "A 123Gb (MLC)/192Gb (TLC) Single-Gate Vertical Channel (SGVC) Architecture 3D NAND using only 16 Layers with Robust Read Disturb, Long-Retention and Excellent Scaling Capability", IEDM 2017.

* cited by examiner

VERTICAL MEMORY DEVICE

CROSS-REFERENCE TO RELATED APPLICATIONS

This application claims priority under 35 U.S.C. § 119 to Korean Patent Application No. 10-2018-0165352 filed on Dec. 19, 2018 in the Korean Intellectual Property Office, the disclosure of which is incorporated by reference herein in its entirety.

TECHNICAL FIELD

Exemplary embodiments of the present inventive concept relate to a vertical memory device.

DISCUSSION OF THE RELATED ART

Although the size of electronic devices has been gradually reduced, it is still desirable for such electronic devices to be capable of processing high capacity data. To achieve this, the degree of integration of semiconductor memory devices has been increasing. Accordingly, a vertical memory device in which memory cells having a stacked vertical transistor structure rather than having an existing planar transistor structure has been proposed.

SUMMARY

Exemplary embodiments of the present inventive concept provide a vertical memory device having improved integration and excellent electrical characteristics.

According to an exemplary embodiment of the present inventive concept, a vertical memory device includes a stacked structure including a plurality of gate electrode layers stacked on a substrate, a plurality of channel layers extending in a direction perpendicular to an upper surface of the substrate on a first side surface of the stacked structure and spaced apart from each other in a direction parallel to the upper surface of the substrate, and a common source layer disposed between the stacked structure and the substrate and contacting the channel layers.

According to an exemplary embodiment of the present inventive concept, a vertical memory device includes a plurality of separation patterns disposed on a substrate and spaced apart from each other. The separation patterns extend in a first direction parallel to an upper surface of the substrate. The vertical memory device further includes a first stacked structure and a second stacked structure disposed between the separation patterns and extending in the first direction. The first stacked structure and the second stacked structure each include a plurality of gate electrode layers. The vertical memory device further includes a plurality of first channel layers disposed on a side surface of the first stacked structure, a plurality of second channel layers disposed on a side surface of the second stacked structure and facing the first channel layers, and a common source layer disposed between the substrate and at least one of the first stacked structure and the second stacked structure and electrically connected to the first channel layers and the second channel layers.

According to an exemplary embodiment of the present inventive concept, a vertical memory device includes a stacked structure stacked on a substrate and including a plurality of conductive layers extending in a direction parallel to an upper surface of the substrate, and a plurality of channel layers extending in a direction perpendicular to the upper surface of the substrate, disposed on a side surface of the stacked structure, and spaced apart from each other. At least one of the plurality of conductive layers contacts the channel layers.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
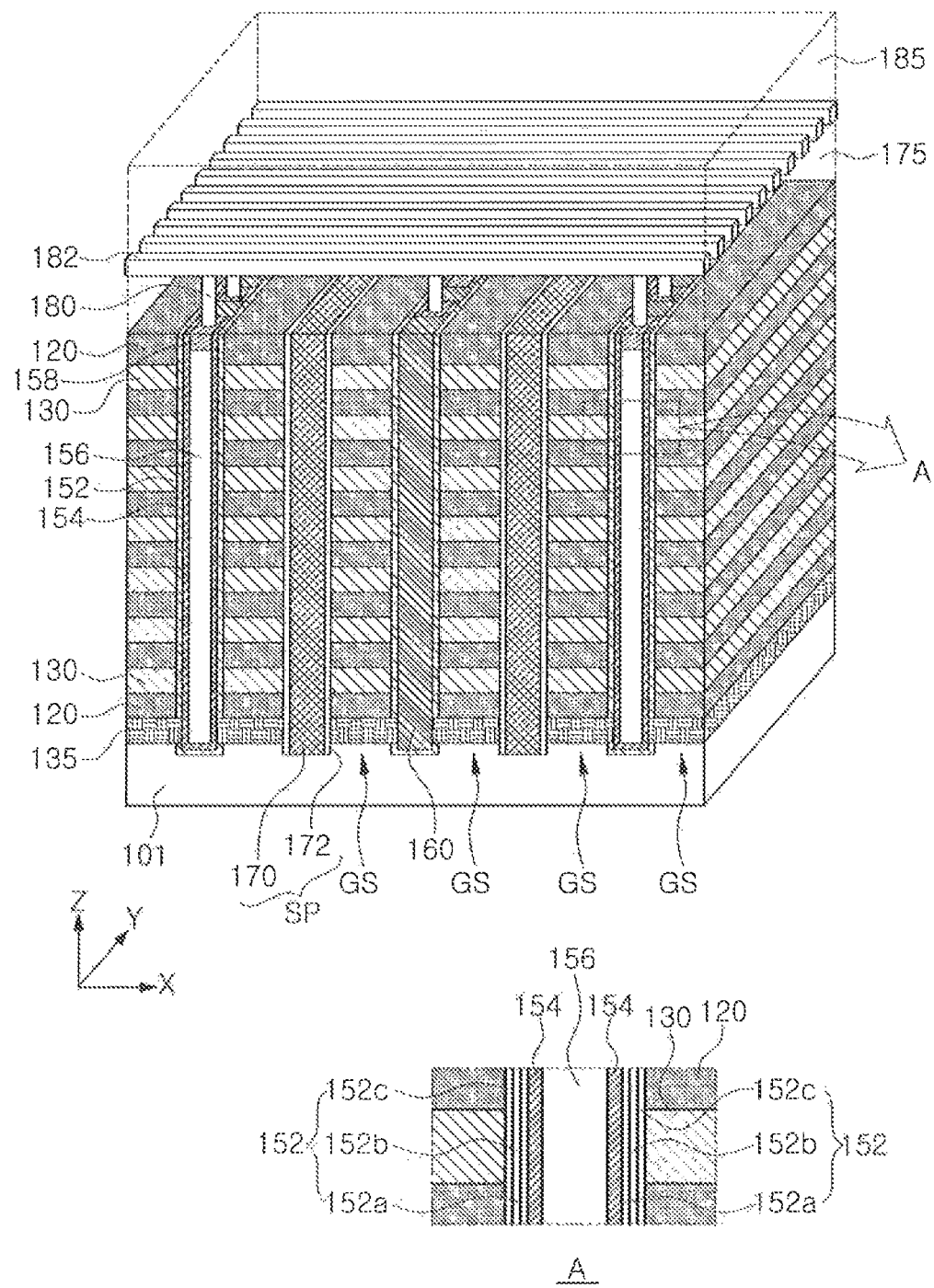
FIG. 1 is a perspective view illustrating a vertical memory device according to an exemplary embodiment.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when an element is referred to as being "between" two elements, it can be the only element between the two elements, or one or more intervening elements may also be present. It will also be understood that when an element is referred to as "covering" another element, it can be the only element covering the other element, or one or more intervening elements may also be covering the other element.

It will be understood that the terms "first," "second," "third," etc. are used herein to distinguish one element from another, and the elements are not limited by these terms.

Thus, a "first" element in an exemplary embodiment may be described as a "second" element in another exemplary embodiment.

As used herein, the singular forms "a", "an" and "the" are intended to include the plural forms as well, unless the context clearly indicates otherwise.

FIG. 1 is a perspective view illustrating a vertical memory device according to an exemplary embodiment.

Referring to FIG. 1, a vertical memory device 10 may include stacked structures GS including insulating layers 120 and first conductive layers 130 alternately stacked on a substrate 101, channel layers 154 disposed on one side surface of the stacked structures GS, a gate insulating layer 152 disposed between the channel layers 154 and the stacked structures GS, and second conductive layers 135 disposed between the stacked structures GS and the substrate 101 to be in contact with the channel layers 154. For example, the second conductive layers 135 disposed between the stacked structures GS and the substrate 101 may penetrate through the gate insulating layers 152 such that the second conductive layers 135 contact the channel layers 154. The first conductive layers 130 may be referred to as gate electrode layers, and the second conductive layers 135 may be referred to as a common source layer.

In addition, the vertical memory device 10 may include gap fill insulating layers 156 filling a space between the channel layers 154, conductive pad layers 158 disposed on the gap fill insulating layers 156 and contacting the channel layers 154, and cutting insulating layers 160 disposed alternately with the gap fill insulating layers 156 on the one side surface of the stacked structures GS and electrically insulating the channel layers 154.

The vertical memory device 10 may include separation patterns SP disposed between the stacked structures GS. The separation patterns SP may be disposed at specific intervals in a first direction, for example, an X direction. A pair of stacked structures GS and a pair of second conductive layers 135 may be disposed between the separation patterns SP. Each of the separation patterns SP may include a separation insulating layer 172 and a conductive layer 170. The separation insulating layer 172 may electrically isolate the first conductive layers 130 of the stacked structures GS from the conductive layer 170.

Referring to one stacked structure GS, channel layers 154 may be disposed on a first side surface of the stacked structure GS, and a separation pattern SP may be disposed on a second side surface of the stacked structure GS that opposes the first side surface.

In an exemplary embodiment, a plurality of separation patterns SP may be disposed on the substrate 101 and spaced apart from each other. A first stacked structure GS and a second stacked structure GS may be disposed between the separation patterns SP. A plurality of first channel layers 154 may be disposed on a side surface of the first stacked structure GS, and a plurality of second channel layers 154 facing the first channel layers 154 may be disposed on a side surface of the second stacked structure GS. The second conductive layer 135 may be disposed between the substrate 101 and at least one of the first and second stacked structures GS.

The substrate 101 may include a semiconductor material such as, for example, silicon or germanium. In an exemplary embodiment, the substrate 101 may include single-crystal silicon. For example, the substrate 101 may include p-type impurities.

The stacked structures GS may be disposed at specific intervals in the first direction (the X direction). The stacked structures GS may extend in a second direction, for example, a Y direction. The stacked structures GS may have side surfaces opposing each other in the first direction (the X direction), and the side surfaces may be flat surfaces.

The insulating layers 120 and the first conductive layers 130 of the stacked structures GS may be alternately stacked in a third direction perpendicular to an upper surface of the substrate 101, for example, a Z direction. The first conductive layers 130 may be electrically insulated from each other by the insulating layers 120. The insulating layer 120 may include, for example, silicon oxide, silicon oxynitride, silicon nitride, silicon oxycarbide (SiOC), silicon oxyfluoride (SiOF), or a combination thereof. The first conductive layer 130 may include, for example, p-type polycrystalline silicon, a metal, metal nitride, or a combination thereof. The number of the first conductive layers 130 illustrated in FIG. 1 is provided by way of example, and thus, the first conductive layers 130 may be stacked in several tens to hundreds of layers in consideration of a memory capacity or the degree of integration of the vertical memory device 10.

In an exemplary embodiment, the first conductive layers 130 and the second conductive layers 135 may include p-type polycrystalline silicon. In an exemplary embodiment, the first conductive layers 130 include p-type polycrystalline silicon, and the second conductive layers 135 include n-type polycrystalline silicon.

The gate insulating layer 152 and the channel layers 154 may be disposed on one side surface of the stacked structure GS, and the separation insulating layer 172 and the conductive layer 170 may be disposed on the other side surface of the stacked structure GS. The gate insulating layer 152 may extend continuously along an entirety of one side surface of the stacked structure GS in the second direction (the Y direction). Thus, the gate insulating layer 152 may cover the entirety of the one side surface of the stacked structure GS. Further, the channel layers 154 may be disposed along the one side surface of the stacked structure GS to be spaced apart from each other in the second direction (the Y direction). Thus, the channel layers 154 may be spaced apart from each other in a direction parallel to the upper surface of the substrate 101. The channel layers 154 may extend in the third direction (the Z direction) from an upper end of the stacked structure GS toward the substrate 101. Thus, the channel layers 154 may extend in a direction perpendicular to the upper surface of the substrate 101. The channel layers 154 disposed on the sides of the stacked structures GS adjacent to each other and disposed between the separation patterns SP may face each other in the first direction (the X direction).

The separation insulating layer 172 and the conductive layer 170 may continuously extend along the other side of the stacked structure GS in the second direction (the Y direction). The separation insulating layer 172 and the conductive layer 170 may extend from the substrate 101 in the third direction (the Z direction). A portion of the separation insulating layer 172 and a portion of the conductive layer 170 may be inserted into the substrate 101. The gate insulating layer 152 may include, for example, a tunneling insulating layer 152a, a charge trapping layer 152b, and a blocking insulating layer 152c. The tunneling insulating layer 152a may contact the channel layer 154, and the blocking insulating layer 152c may contact the insulating layers 120 and the first conductive layers 130. The charge trapping layer 152b may be disposed between the tunneling insulating layer 152a and the blocking insulating layer 152c. The tunneling insulating layer 152a may include, for example, silicon oxide. The charge trapping layer 152b may include, for example, silicon nitride. The blocking insulating layer 152c may include, for example, silicon oxide, a high-dielectric material, or a combination thereof. The high-dielectric material may include a metal oxide having a high dielectric constant such as, for example, a hafnium oxide, an aluminum oxide, or the like. The channel layer 154 may include undoped polycrystalline silicon. The separation insulating layer 172 may include, for example, silicon oxide, silicon oxynitride, silicon nitride, silicon oxycarbide (SiOC), silicon oxyfluoride (SiOF), or a combination thereof. The conductive layer 170 may include, for example, a metal such as tungsten or the like.

On one side of the stacked structure GS, the channel layers 154 may be disposed alternately with the cutting insulating layers 160 in the second direction (the Y direction). On one side of the stacked structure GS, the cutting insulating layers 160 may be disposed alternately with the gap fill insulating layers 156 in the second direction (the Y direction). The gap fill insulating layer 156 and the cutting insulating layer 160 may include, for example, silicon oxide, silicon oxynitride, silicon nitride, silicon oxycarbide (SiOC), silicon oxyfluoride (SiOF), or a combination thereof. The conductive pad layers 158 disposed on the gap fill insulating layer 156 and in contact with the channel layers 154 may be alternately disposed with the cutting insulating layers 160 in the second direction (the Y direction). The conductive pad layer 158 may include, for example, polycrystalline silicon. The conductive pad layer 158 may include, for example, n-type impurities.

The cutting insulating layers 160 may be disposed in a zigzag manner in the first direction (the X direction). The channel layers 154, the conductive pad layers 158, and the gap fill insulating layers 156 may also be disposed in a zigzag manner in the first direction (the X direction).

The second conductive layers 135 may be disposed below all of the stacked structures GS. The second conductive layers 135 disposed between the stacked structures GS and the substrate 101 may contact the substrate 101, and may be insulated from the first conductive layer 130 by the insulating layer 120. The channel layers 154 may be electrically connected to the substrate 101 by the second conductive layers 135.

One side of the second conductive layers 135 may be in contact with the channel layers 154 and the cutting insulating layers 160, and the other side of the second conductive layers 135 may be in contact with the separation insulating layer 172. The second conductive layer 135 may include, for example, p-type polycrystalline silicon, n-type polycrystalline silicon, a metal, metal nitride, or a combination thereof. The second conductive layer 135 may be formed of the same material as that of the first conductive layer 130. For example, the second conductive layer 135 and the first conductive layer 130 may include p-type polycrystalline silicon. In an exemplary embodiment, the second conductive layer 135 may be formed of a material different from that of the first conductive layer 130. For example, the second conductive layer 135 may include n-type polycrystalline silicon, and the first conductive layer 130 may include p-type polycrystalline silicon.

Further, the vertical memory device 10 may include vias 180 penetrating through an interlayer insulating layer 175 formed on the stacked structures GS, to be electrically connected to the conductive pad layer 158, bit lines 182 electrically connected to the vias 180, and an interlayer insulating layer 185 covering the bit lines 182. The vias 180 may be disposed in a zigzag manner in the first direction (the X direction). The bit lines 182 may extend in the first direction (the X direction). Each bit line 182 may be connected to vias 180 disposed in a single linear form in the first direction (the X direction).

In FIG. 1, an area A including the gate insulating layer 152, the channel layers 154, and the gap fill insulating layers 156 is enlarged and illustrated for convenience of illustration.

Figure 2:
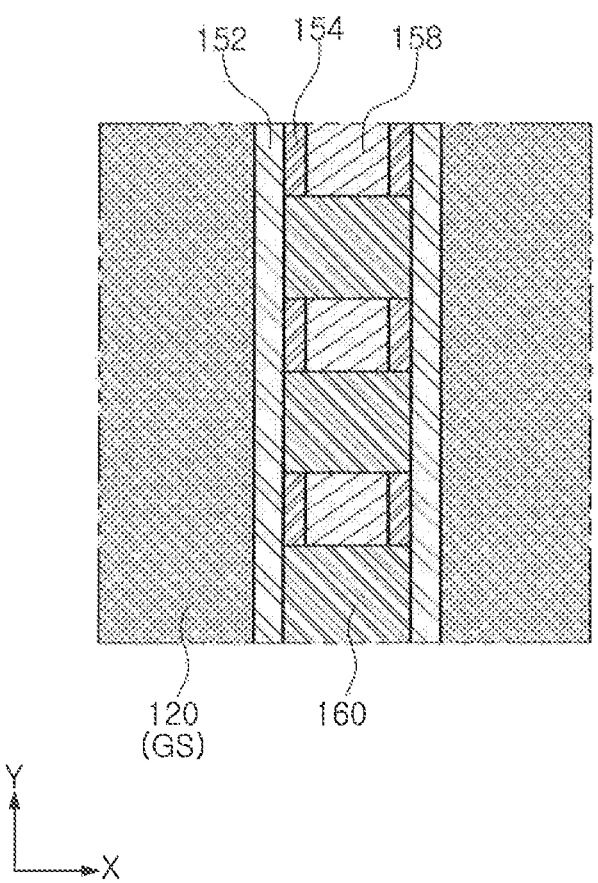
FIGS. 2 and 3 are plan views illustrating portions of a vertical memory device according to exemplary embodiments.
Figure 3:
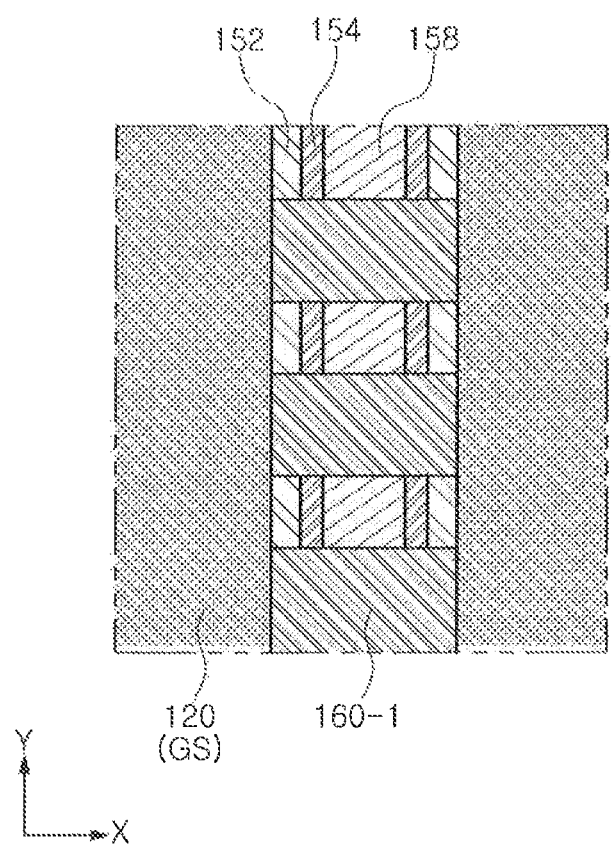

FIGS. 2 and 3 are plan views illustrating portions of a vertical memory device according to exemplary embodiments.

Referring to FIG. 2, the channel layers 154 and the conductive pad layers 158 may be separated by the cutting insulating layers 160 disposed at specific intervals in the second direction (the Y direction). At least a portion of the gate insulating layer 152 may be disposed between the cutting insulating layers 160 and the stacked structure GS.

Referring to FIG. 3, the gate insulating layers 152, as well as the channel layers 154 and the conductive pad layers 158, may also be separated by a cutting insulating layer 160-1 disposed at a predetermined interval in the second direction (the Y direction). A width of the cutting insulating layer 160-1 in the first direction (the X direction) may be greater than a width of the cutting insulating layer 160 of FIG. 2 in the first direction (the X direction). For example, in FIG. 3, the cutting insulating layer 160-1 may extend all the way to the stacked structures GS, unlike the cutting insulating layer 160 in FIG. 2. Sides of the cutting insulating layers 160-1 may contact the stacked structures GS, and lower ends of the cutting insulating layers 160-1 may contact the substrate 101 (see FIG. 1).

FIGS. 2 and 3 illustrate that planar shapes of the cutting insulating layer 160 and the cutting insulating layer 160-1 are illustrated to be rectangular. However, exemplary embodiments are not limited thereto. For example, in an exemplary embodiment, the planar shapes of the cutting insulating layer 160 and the cutting insulating layer 160-1 may be elliptical.

FIGS. 4 to 8 are schematic perspective views illustrating a method of manufacturing the vertical memory device 10 according to an exemplary embodiment.

Figure 4:
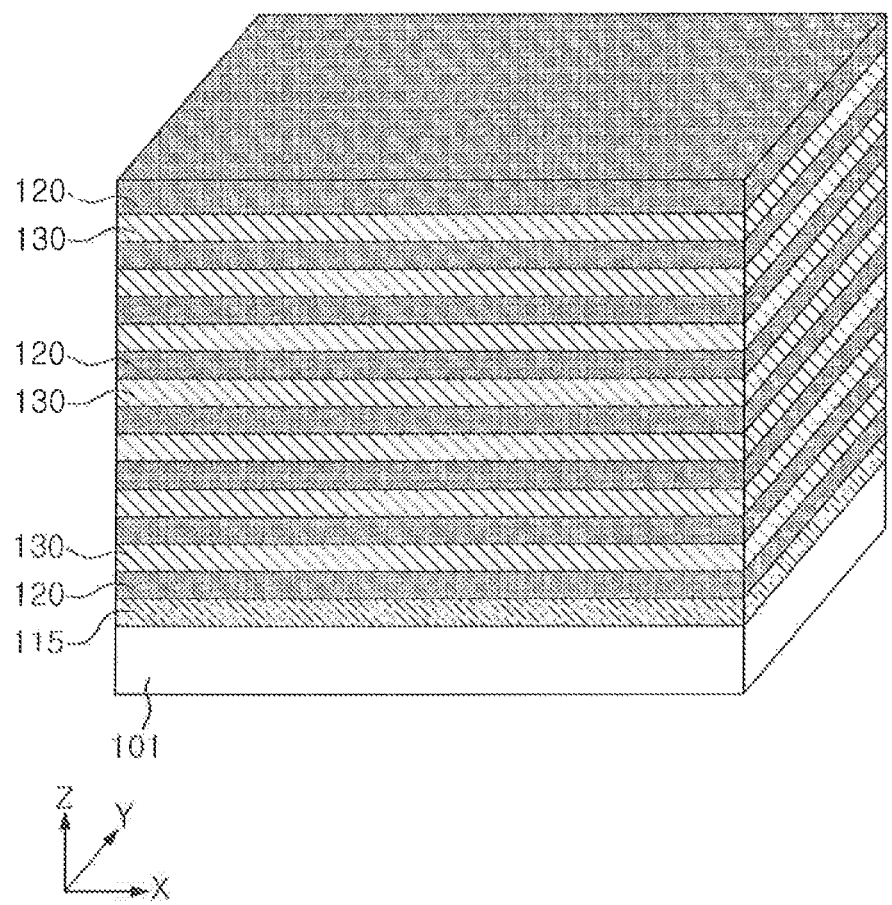
FIGS. 4 to 8 are schematic perspective views illustrating a method of manufacturing a vertical memory device according to an exemplary embodiment.

Referring to FIG. 4, a sacrificial layer 115 may be formed on the substrate 101 to cover an entire upper surface of the substrate 101. Subsequently, the insulating layers 120 and the first conductive layers 130 may be alternately formed on the sacrificial layer 115. The insulating layers 120 and the first conductive layers 130 may be alternately stacked in the third direction (the Z direction) perpendicular to the upper surface of the substrate 101. The first conductive layers 130 may be electrically insulated from each other by the insulating layers 120.

The sacrificial layer 115 may include, for example, silicon nitride, n-type polycrystalline silicon, a silicon-germanium compound, germanium, aluminum oxide, or a combination thereof. The insulating layer 120 may include, for example, silicon oxide, silicon oxynitride, silicon nitride or a combination thereof. The first conductive layer 130 may include, for example, p-type polycrystalline silicon, a metal, a metal nitride, or a combination thereof.

Figure 5:
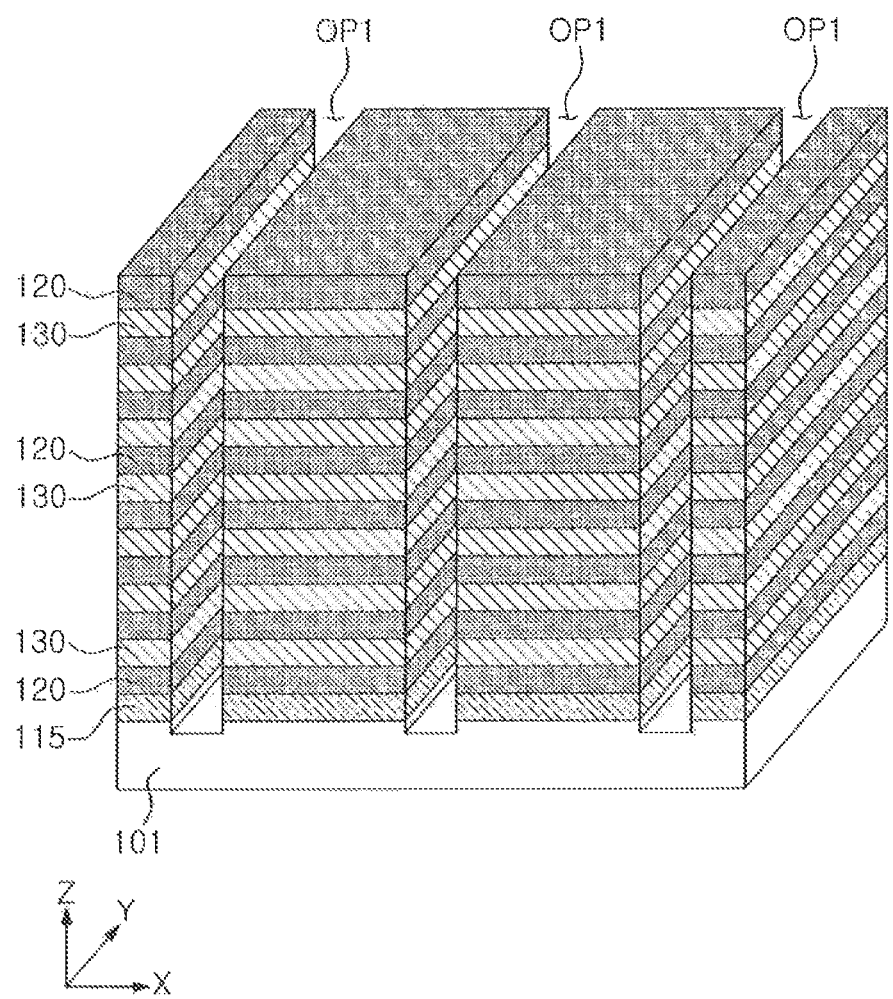

Referring to FIG. 5, the insulating layers 120, the first conductive layers 130, and the sacrificial layer 115 may be anisotropically etched to form first openings OP1 extending in the second direction (the Y direction) parallel to the upper surface of the substrate 101.

The first openings OP1 may be spaced apart from each other in the first direction (the X direction) parallel to the upper surface of the substrate 101 and perpendicularly intersecting the second direction (the Y direction). The first openings OP1 may be disposed at specific intervals in the first direction (the X direction). The first openings OP1 may pass through the insulating layers 120, the first conductive layers 130 and the sacrificial layer 115, and the substrate 101 may be exposed by the first openings OP1. A portion of the substrate 101 may be etched in such a manner that recesses may be formed in an upper portion of the substrate 101 to be connected to the first openings OP1.

Figure 6:
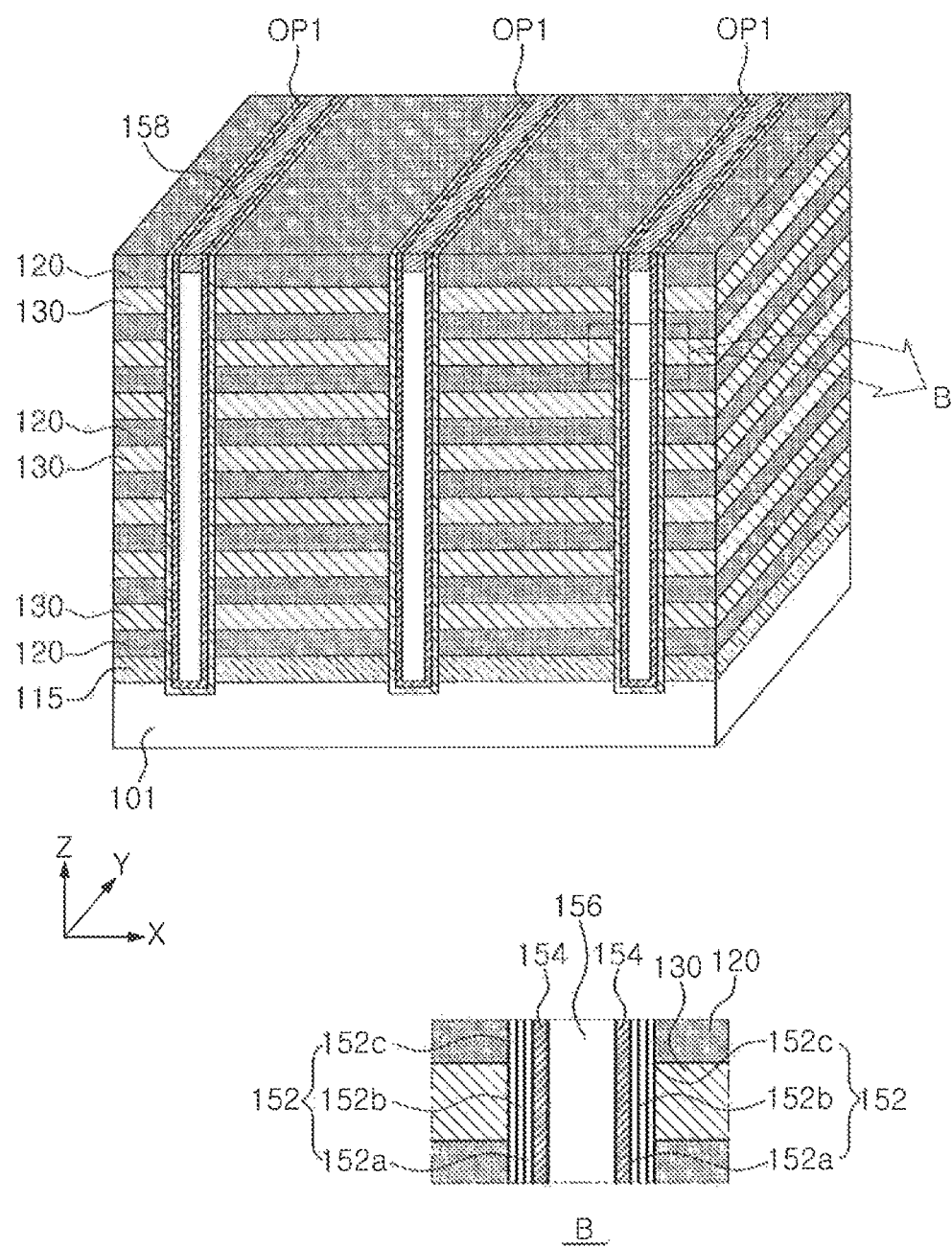

Referring to FIG. 6, the gate insulating layer 152 and the channel layer 154 may be conformally formed on inner walls of the first openings OP1.

The gate insulating layer 152 may include the tunneling insulating layer 152a, the charge trapping layer 152b, and the blocking insulating layer 152c. The tunneling insulating layer 152a may be in contact with the channel layer 154, and the blocking insulating layer 152c may be in contact with the insulating layers 120 and the conductive layers 130. The charge trapping layer 152b may be disposed between the tunneling insulating layer 152a and the blocking insulating layer 152c.

The blocking insulating layer 152c may be conformally formed on the inner walls and bottoms of the first openings OP1, the charge trapping layer 152b may be formed conformally thereon, and the tunneling insulating layer 152a may be conformally formed thereon. After forming the tunneling insulating layer 152a, the channel layer 154 may be formed.

The tunneling insulating layer 152a may include, for example, silicon oxide. The charge trapping layer 152b may include, for example, silicon nitride. The blocking insulating layer 152c may include, for example, silicon oxide, a high-dielectric material, or a combination thereof. The channel layer 154 may include, for example, undoped polycrystalline silicon.

The remaining spaces of the first openings OP1 may be filled with the gap fill insulating layer 156. The gap fill insulating layer 156 may include, for example, silicon oxide.

The tunneling insulating layer 152a, the charge trapping layer 152b, and the blocking insulating layer 152c on the insulating layer 120 may be removed by a chemical mechanical polishing (CMP) process.

After removing a portion of the gap fill insulating layer 156, the conductive pad layer 158 may be formed. The conductive pad layer 158 may contact the channel layer 154 and be electrically connected thereto. The conductive pad layer 158 may include, for example, polycrystalline silicon. The conductive pad layer 158 may include, for example, n-type impurities.

In FIG. 6, an area B including the gate insulating layer 152, the channel layers 154, and the gap fill insulating layers 156 is enlarged and illustrated for convenience of illustration.

Figure 7:
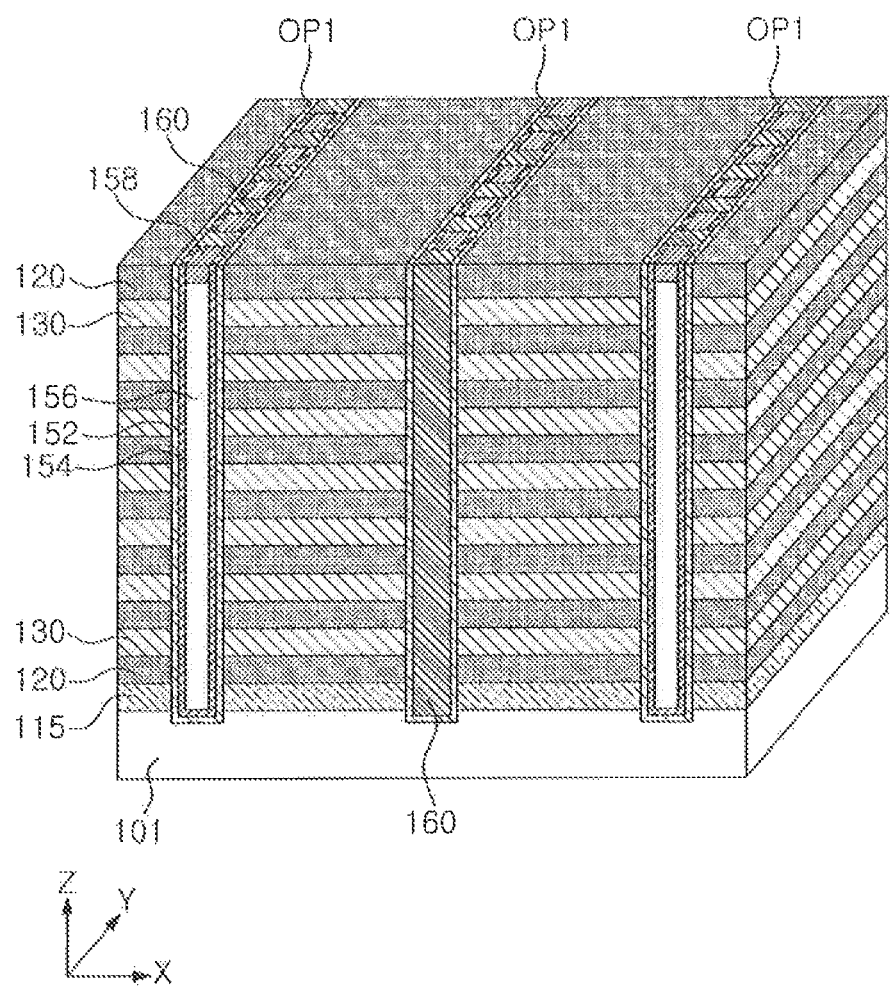

Referring to FIG. 7, the cutting insulating layers 160 may be formed to cut the channel layer 154 into cell unit sized portions. The conductive pad layer 158 and the gap fill insulating layer 156 may also be cut into cell unit sized portions by the cutting insulating layers 160. The cutting insulating layers 160 may be disposed at specific intervals in the second direction (the Y direction). The channel layer 154 may be divided into a plurality of channel layers 154 spaced apart from each other in the second direction (the Y direction) by the cutting insulating layers 160. The gap fill insulating layer 156 and the conductive pad layer 158 may also be divided into a plurality of gap fill insulating layers 156 and a plurality of conductive pad layers 158 spaced apart from each other in the second direction (the Y direction).

The cutting insulating layers 160 may be disposed in a zigzag manner in the first direction (the X direction). The channel layers 154, the conductive pad layers 158, and the gap fill insulating layers 156 may also be disposed in a zigzag manner in the first direction (the X direction).

A portion of the conductive pad layer 158, a portion of the gap fill insulating layer 156, and a portion of the channel layer 154 may be removed by an etching process using an etching mask including a plurality of hole patterns to form a plurality of cutting holes. Then, the cutting holes may be refilled with an insulating material, thereby forming the cutting insulating layers 160. The etching process may be, for example, an anisotropic etching process, an isotropic etching process, or a combination thereof. In an exemplary embodiment, when forming the plurality of cutting holes, a portion of the gate insulating layer 152 may also be removed. The plurality of cutting holes may expose the insulating layer 120, the first conductive layer 130, and the substrate 101. The cutting insulating layers 160 may contact the insulating layer 120, the first conductive layer 130, and the substrate 101.

The cutting insulating layer 160 may include, for example, silicon oxide, silicon oxynitride, silicon nitride, or a combination thereof.

Figure 8:
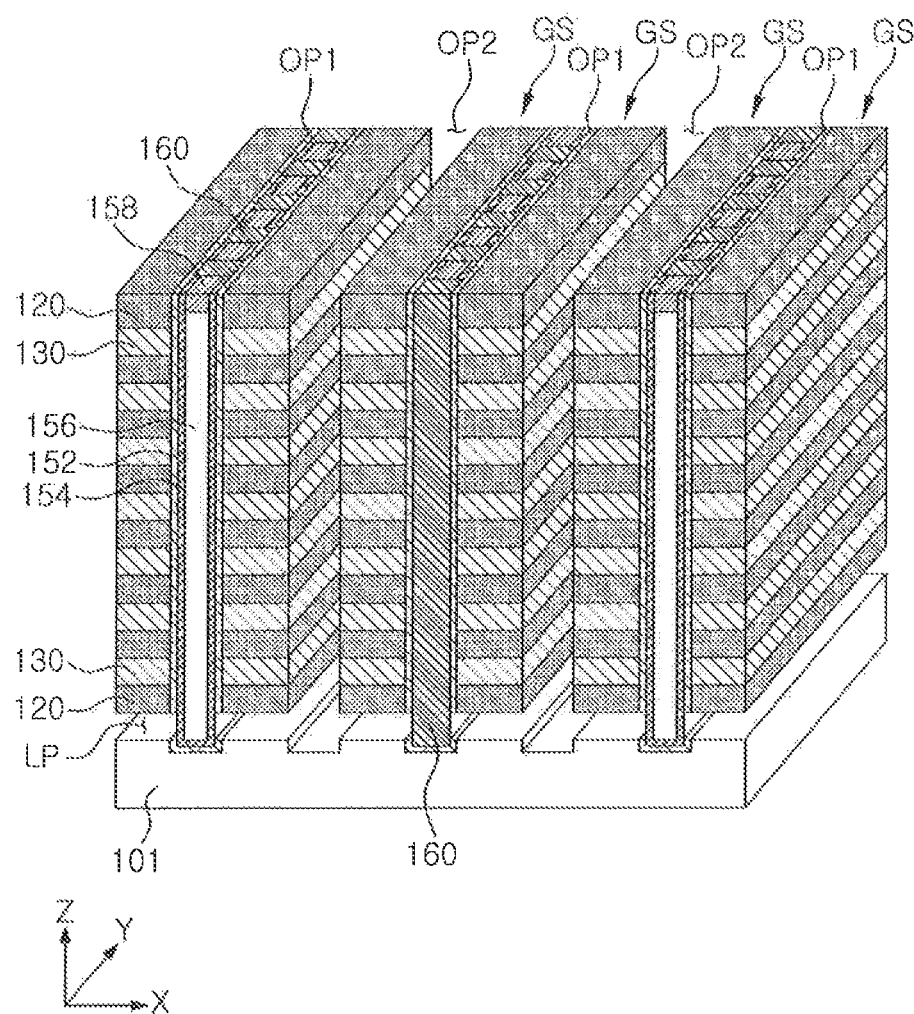

Referring to FIG. 8, the insulating layers 120, the first conductive layers 130, and the sacrificial layer 115 may be anisotropic ally etched to form second openings OP2 extending in the second direction (the Y direction) parallel to the upper surface of the substrate 101.

The second openings OP2 may be spaced apart from each other in the first direction (the X direction). The second openings OP2 may be disposed at specific intervals in the first direction (the X direction). The second openings OP2 may be disposed at the same interval as that between the first openings OP1 in the first direction (the X direction). The second openings OP2 may be formed between the first openings OP1. The second openings OP2 may be formed between the channel layers 154 and between the cutting insulating layers 160 in the first direction (the X direction). The second openings OP2 may penetrate through the insulating layers 120, the first conductive layers 130, and the sacrificial layer 115, and the sacrificial layer 115 may be exposed by the second openings OP2. According to an exemplary embodiment, the second openings OP2 do not penetrate through the sacrificial layer 115, and the sacrificial layer 115 may be exposed by the second openings OP2.

By removing the exposed sacrificial layer 115, a side opening portion LP may be formed to expose the gate insulating layers 152. The gate insulating layer 152 exposed through the side opening portion LP may be removed. In an exemplary embodiment, the channel layer 154 may be additionally removed.

Referring again to FIG. 1, the second conductive layer 135 may be formed in the side opening portion LP, and the separation insulating layer 172 and the conductive layer 170 may be formed in the second openings OP2. In an exemplary embodiment, the conductive layer 170 is not formed.

The vias 180 may be formed to penetrate through the interlayer insulating layer 175 to be electrically connected to the conductive pad layer 158, and the bit lines 182 may be formed to be electrically connected to the vias 180. The interlayer insulating layer 185 may be formed to cover the bit lines 182.

Figure 9:
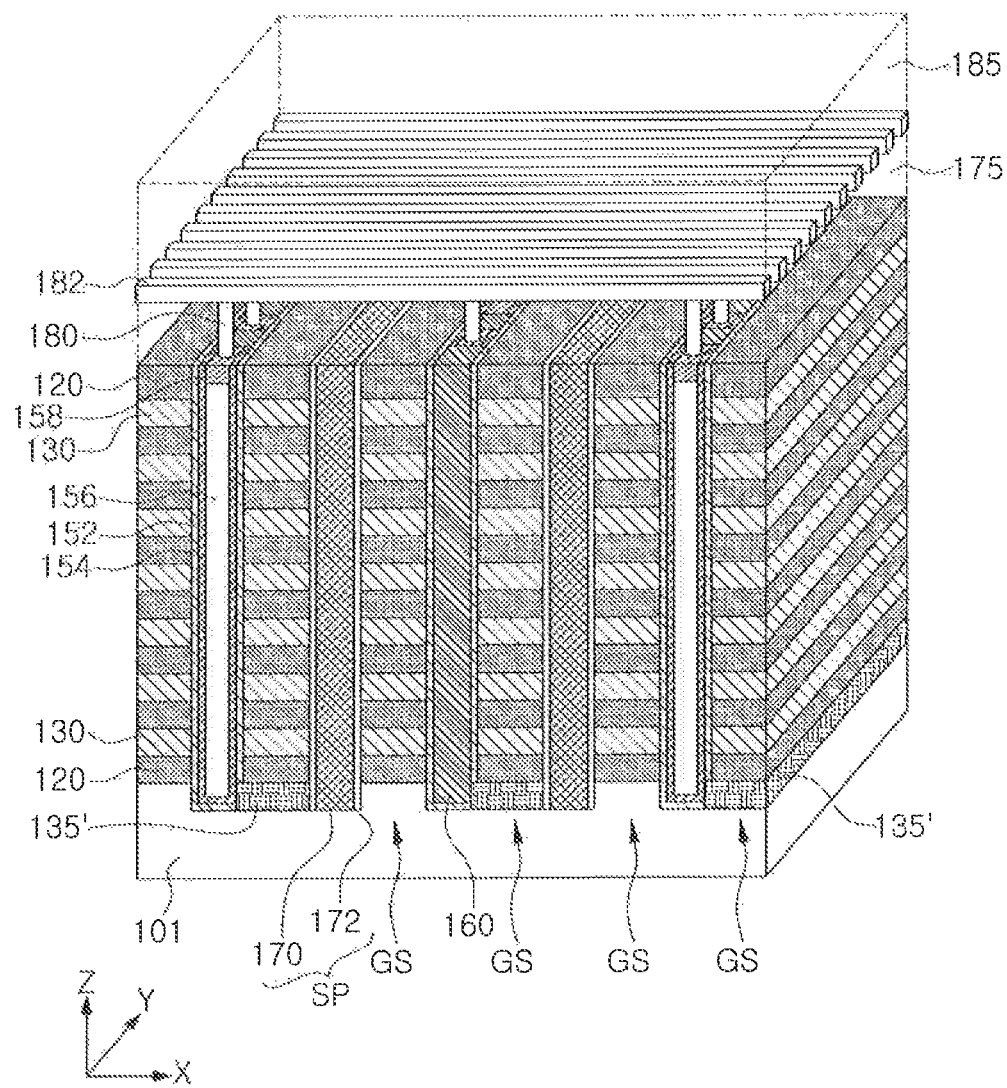
FIG. 9 is a perspective view illustrating a vertical memory device according to an example embodiment.

FIG. 9 is a perspective view illustrating a vertical memory device 10A according to an exemplary embodiment. The vertical memory device 10A of FIG. 9 is similar to the vertical memory device 10 of FIG. 1. For convenience of explanation, the differences between the vertical memory device 10A of FIG. 9 and the vertical memory device 10 of FIG. 1 will be primarily described below with reference to FIG. 9, and a further description of elements and technical aspects previously described may be omitted.

Referring to FIG. 9, a second conductive layer 135' disposed between stacked structures GS and the substrate 101 may be disposed in a stripe form. For example, the second conductive layer 135' may include a plurality of portions spaced apart from each other and extending in the same direction.

A plurality of the second conductive layers 135' may only be disposed below a portion of the stacked structures GS, rather than the second conductive layers 135' being disposed below all of the stacked structures GS.

For example, the second conductive layer 135' may be disposed below only one stacked structure GS among a pair of the stacked structures GS disposed between separation patterns SP. The other stacked structure GS of the pair of stacked structures GS may be directly disposed on the upper surface of the substrate 101. Upper surfaces of the second conductive layer 135' may be coplanar with the upper surface of the substrate 101. For example, upper surfaces of the second conductive layers 135' and the upper surface of the substrate 101 may be substantially aligned with each other. The channel layers 154 may be electrically connected to the substrate 101 by the second conductive layer 135'.

Figure 10:
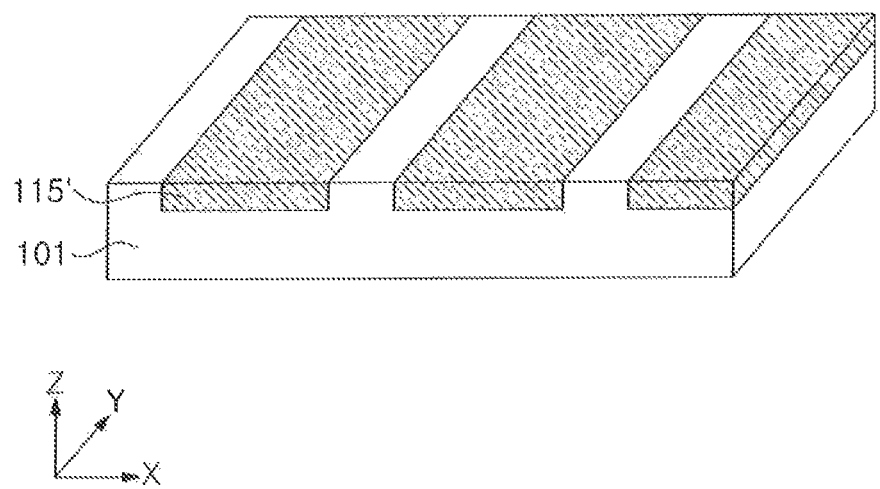
FIG. 10 is a schematic perspective view illustrating a method of manufacturing a vertical memory device according to an exemplary embodiment.

FIG. 10 is a schematic perspective view illustrating a method of manufacturing the vertical memory device 10A according to an exemplary embodiment.

Referring to FIG. 10, sacrificial layers 115' in the form of a stripe may be formed on the substrate 101. For example, the sacrificial layers 115' may include a plurality of portions spaced apart from each other and extending in the same direction. The sacrificial layers 115' may be disposed in regions of the substrate 101 from which a portion of the substrate 101 has been removed, and upper surfaces of the sacrificial layers 115' may be coplanar with the upper surface of the substrate 101. For example, the upper surfaces of the sacrificial layers 115' may be substantially aligned with the upper surface of the substrate 101.

As described above with reference to FIG. 4, the insulating layers 120 and the first conductive layers 130 may be alternately formed on the substrate 101 and the sacrificial layers 115'. Then, the processes described above with reference to FIGS. 5 to 8 may be performed.

Referring again to FIG. 9, the second conductive layer 135' may be formed in a side opening portion from which the sacrificial layer 115' has been removed, and a separation insulating layer 172 and a conductive layer 170 may be formed in second openings OP2 (see FIG. 8). In an exemplary embodiment, the conductive layer 170 is not formed.

Vias 180 may be formed to penetrate through an interlayer insulating layer 175 to be electrically connected to a conductive pad layer 158, and bit lines 182 may be formed to be electrically connected to the vias 180. An interlayer insulating layer 185 may be formed to cover the bit lines 182.

Figure 11:
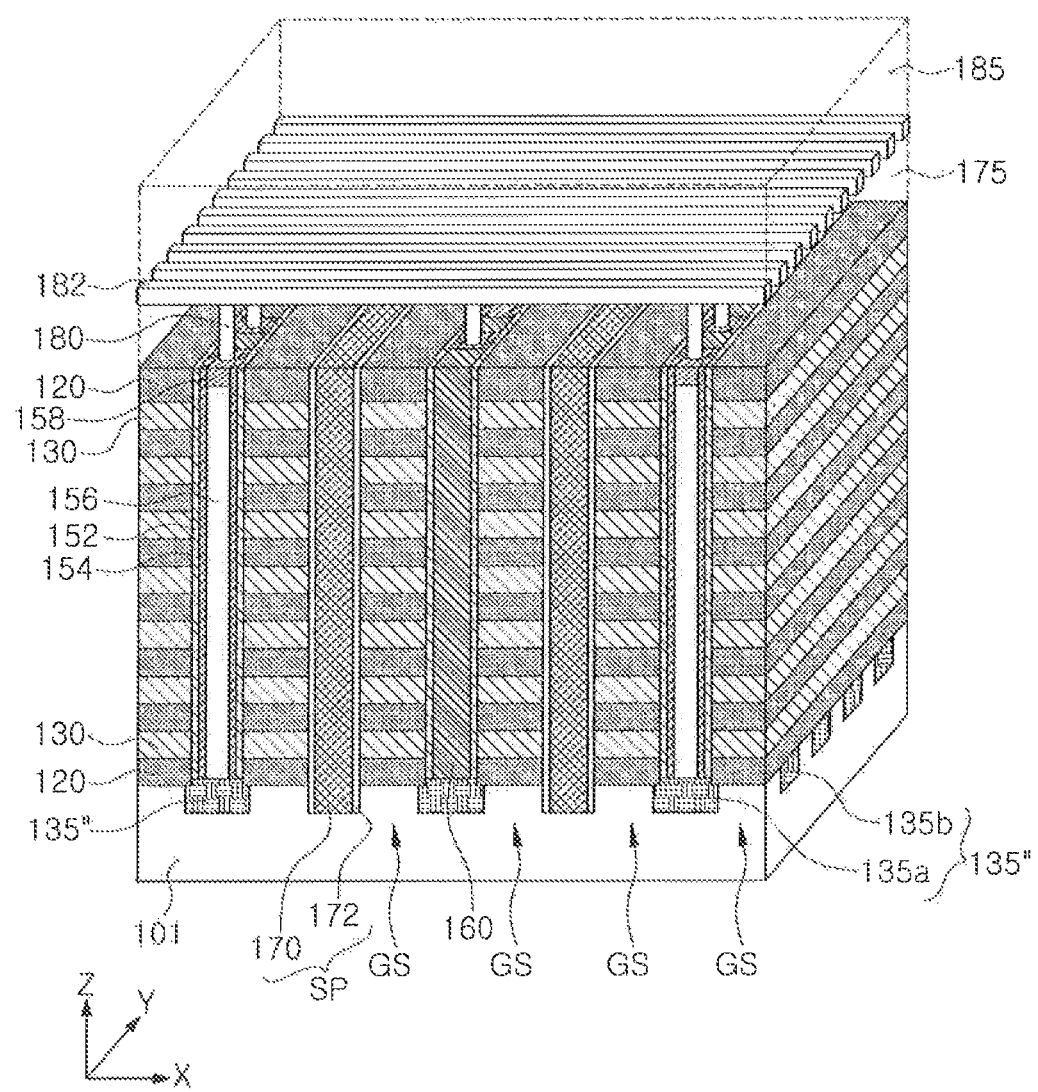
FIG. 11 is a perspective view illustrating a vertical memory device according to an exemplary embodiment.

FIG. 11 is a perspective view illustrating a vertical memory device 10B according to an exemplary embodiment. The vertical memory device 10B of FIG. 11 is similar to the vertical memory device 10 of FIG. 1. For convenience of explanation, the differences between the vertical memory device 10B of FIG. 11 and the vertical memory device 10 of FIG. 1 will be primarily described below with reference to FIG. 11, and a further description of elements and technical aspects previously described may be omitted.

Referring to FIG. 11, a second conductive layer 135" may be disposed between the stacked structures GS and the substrate 101 in a lattice form or a fish-bone form.

For example, below the channel layers 154, first portions 135a of the second conductive layers 135" may be respectively disposed to extend in the second direction (the Y direction), and second portions 135b of the second conductive layers 135" may be disposed to extend in the first direction (the X direction) to intersect with the first portions 135a of the second conductive layers 135". The first portions 135a of the second conductive layers 135" may contact lower ends of the channel layers 154. Upper surfaces of the second conductive layers 135" may be coplanar with an upper surface of the substrate 101. For example, the upper surfaces of the second conductive layers 135" and the upper surface of the substrate 101 may be substantially aligned with each other.

The first portions 135a of the second conductive layers 135" may contact lower ends of the channel layers 154, and the channel layers 154 may be electrically connected to the substrate 101 by the second conductive layers 135".

Figure 12:
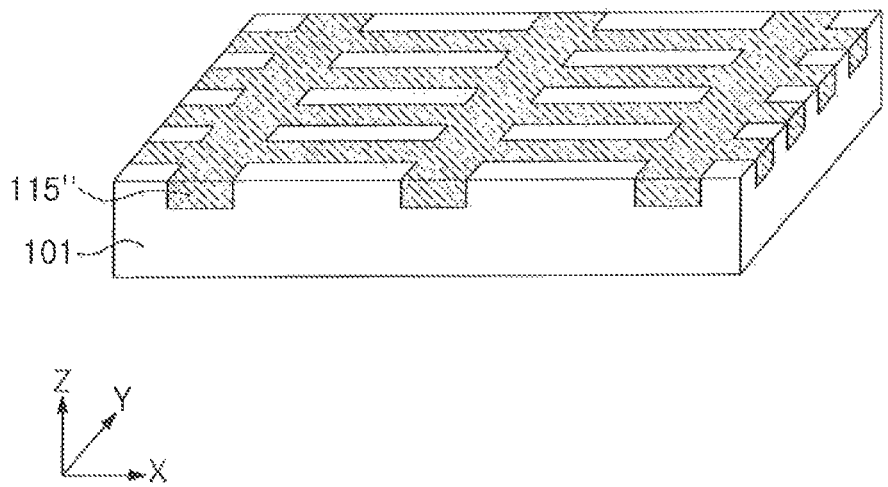
FIG. 12 is a schematic perspective view illustrating a method of manufacturing a vertical memory device according to an exemplary embodiment.

FIG. 12 is a schematic perspective view illustrating a method of manufacturing the vertical memory device 10B according to an exemplary embodiment.

Referring to FIG. 12, sacrificial layers 115" may be formed on the substrate 101 in the form of a lattice. For example, the sacrificial layers 115" may include portions separated from each other and extending in the first direction (the X direction) and portions separated from each other and extending in the second direction (the Y direction). These portions may be connected to each other, thus forming a lattice structure. The sacrificial layers 115" may be disposed in areas of the substrate 101 from which a portion of the substrate 101 has been removed, and upper surfaces of the sacrificial layers 115" may be coplanar with an upper surface of the substrate 101. For example, the upper surfaces of the sacrificial layers 115" and the upper surface of the substrate 101 may be substantially aligned with each other.

Referring to FIG. 4, the insulating layers 120 and the first conductive layers 130 may be alternately formed on the substrate 101 and the sacrificial layers 115". Then, the processes described above with reference to FIGS. 5 to 8 may be performed.

Referring again to FIG. 11, the second conductive layer 135" may be formed in a side opening portion from which the sacrificial layer 115" has been removed, and a separation insulating layer 172 and a conductive layer 170 may be formed in second openings OP2 (see FIG. 8). In an exemplary embodiment, the conductive layer 170 is not formed.

The vias 180 may be formed to penetrate through the interlayer insulating layer 175 to be electrically connected to the conductive pad layer 158, and the bit lines 182 may be formed to be electrically connected to the vias 180. The interlayer insulating layer 185 may be formed to cover the bit lines 182.

Figure 13:
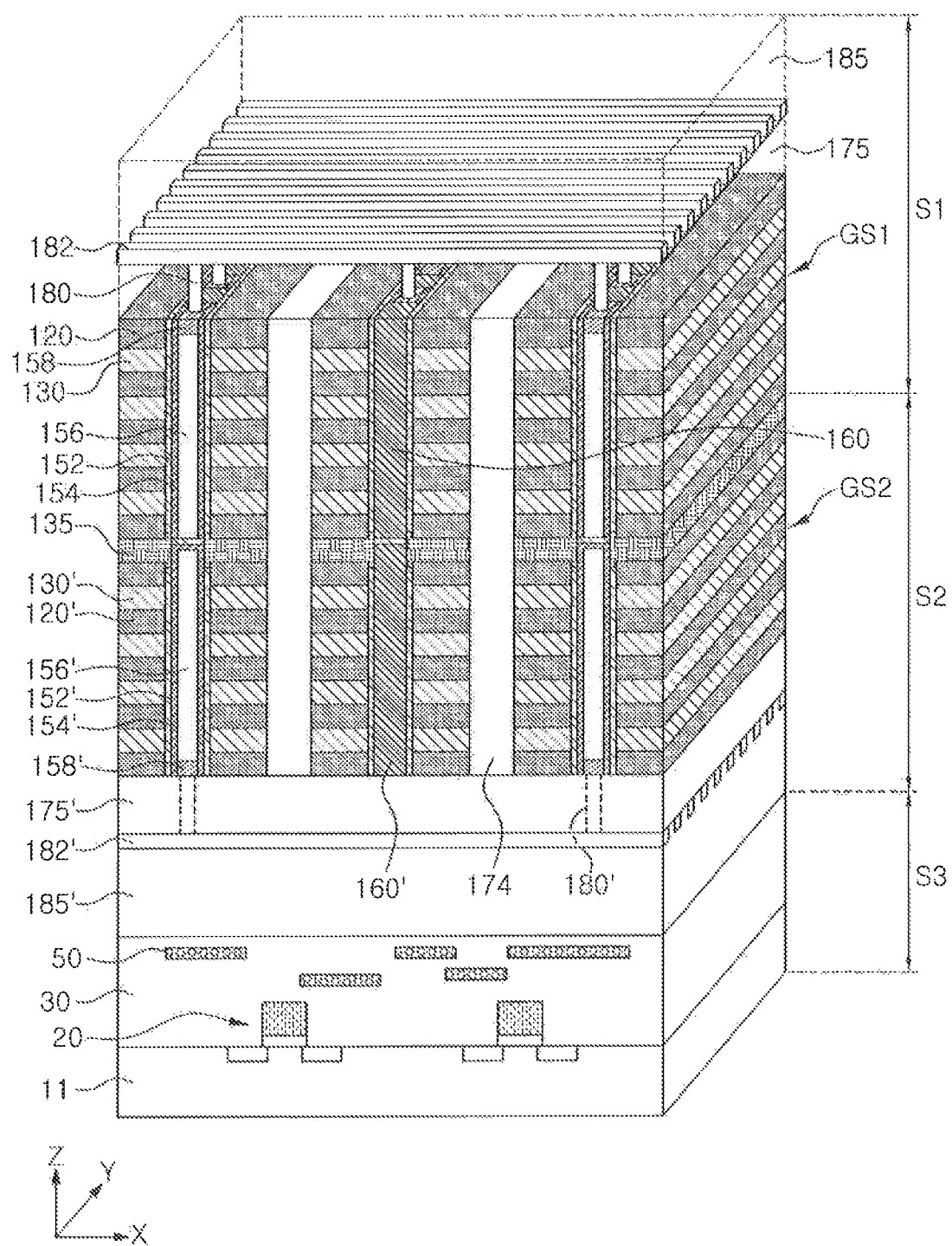
FIG. 13 is a perspective view illustrating a vertical memory device according to an exemplary embodiment.

FIG. 13 is a perspective view illustrating a vertical memory device 10C according to an exemplary embodiment.

Referring to FIG. 13, the vertical memory device 10C may include a lower cell structure S2 and an upper cell structure S1 stacked on a peripheral circuit structure S3.

The peripheral circuit structure S3 may include a base substrate 11, transistors 20, circuit wirings 50, and an interlayer insulating layer 30.

The lower cell structure S2 may include lower stacked structures GS2 including insulating layers 120' and conductive layers 130' alternately stacked. The insulating layers 120' and the conductive layers 130' may be disposed at a specific interval in the first direction (the X direction) and extend in the second direction (the Y direction). The lower cell structure S2 may further include channel layers 154' spaced apart from each other on one side surface of the lower stacked structures GS2 and extending in the third direction (the Z direction), gate insulating layers 152' disposed between the lower stacked structures GS2 and the channel layers 154', gap fill insulating layers 156' disposed between adjacent lower stacked structures GS2 and disposed between the channel layers 154' facing each other in the first direction (the X direction), cutting insulating layers 160' alternately disposed with the gap fill insulating layers 156' in the second direction (the Y direction) between adjacent lower stacked structures GS2, and a conductive pad layer 158' disposed below the gap fill insulating layers 156' and in contact with the channel layers 154'. The lower stacked structures GS2 may be disposed to be spaced apart from each other in the first direction (the X direction). The lower cell structure S2 may include vias 180' penetrating through an interlayer insulating layer 175' to be electrically connected to the conductive pad layer 158', bit lines 182' electrically connected to the vias 180', and an interlayer insulating layer 185' covering the bit lines 182'. The bit lines 182' and the conductive pad layer 158' may be connected to each other by the vias 180'.

The channel layers 154' may be referred to as lower channel layers, and the gate insulating layers 152' may be referred to as lower gate insulating layers. The cutting insulating layers 160' may be referred to as lower cutting insulating layers, and the gap fill insulating layers 156' may be referred to as lower gap fill insulating layers. The conductive pad layer 158' may be referred to as a lower conductive pad layer, and the bit lines 182' may be referred to as lower bit lines.

The upper cell structure S1 may include upper stacked structures GS1 including insulating layers 120 and conductive layers 130. The insulating layers 120 and the conductive layers 130 may be alternately stacked and disposed at a specific interval in the first direction (the X direction) and extend in the second direction (the Y direction). The upper cell structure S1 may further include channel layers 154 spaced apart from each other on one side surface of the upper stacked structures GS1 and extending in the third direction (the Z direction), gate insulating layers 152 disposed between the upper stacked structures GS1 and the channel layers 154, gap fill insulating layers 156 disposed between adjacent upper stacked structures GS1 and disposed between the channel layers 154 facing each other in the first direction (the X direction), cutting insulating layers 160 alternately disposed with the gap fill insulating layers 156 in the second direction (the Y direction) between adjacent upper stacked structures GS1, and a conductive pad layer 158 disposed on the gap fill insulating layers 156 and in contact with the channel layers 154. The upper stacked structures GS1 may be disposed to be spaced apart from each other in the first direction (the X direction). The upper cell structure S1 may include vias 180 penetrating through the interlayer insulating layer 175 to be electrically connected to the conductive pad layer 158, bit lines 182 electrically connected to the vias 180, and the interlayer insulating layer 185 covering the bit lines 182. The bit lines 182 and the conductive pad layer 158 may be connected to each other by the vias 180.

The channel layers 154 may be referred to as upper channel layers, and the gate insulating layers 152 may be referred to as upper gate insulating layers. The cutting insulating layers 160 may be referred to as upper cutting insulating layers, and the gap fill insulating layers 156 may be referred to as upper gap fill insulating layers. The conductive pad layer 158 may be referred to as an upper conductive pad layer, and the bit lines 182 may be referred to as upper bit lines.

The conductive layers 135 may be referred to as intermediate conductive layers, the conductive layers 130 may be referred to as upper conductive layers, and the conductive layers 130' may be referred to as lower conductive layers. The upper conductive layers 130 may be disposed on the intermediate conductive layers 135, and the lower conductive layers 130' may be disposed below the intermediate conductive layers 135.

The vertical memory device 10C may include separation insulating layers 174 disposed at a specific interval in the first direction (the X direction), and conductive layers 135 disposed between the lower stacked structures GS2 and the upper stacked structures GS1. A pair of lower stacked structures GS2, a pair of upper stacked structures GS1, and a pair of conductive layers 135 may be disposed between the separation insulating layers 174. In an exemplary embodiment, a pair of lower stacked structures GS2, a pair of upper stacked structures GS1, and a single conductive layer 135 may be disposed between the separation insulating layers 174.

The conductive layers 135 disposed between the lower stacked structures GS2 and the upper stacked structures GS1 may penetrate through the gate insulating layers 152 and 152' to contact the channel layers 154 and 154'. The conductive layers 135 may contact upper portions of channel layers 154' and lower portions of the channel layers 154. The conductive layers 135 may penetrate through the gate insulating layers 152 and 152' to contact the cutting insulating layers 160 and 160'.

FIGS. 14 to 21 are schematic perspective views illustrating a method of manufacturing a vertical memory device 10C according to an exemplary embodiment.

Figure 14:
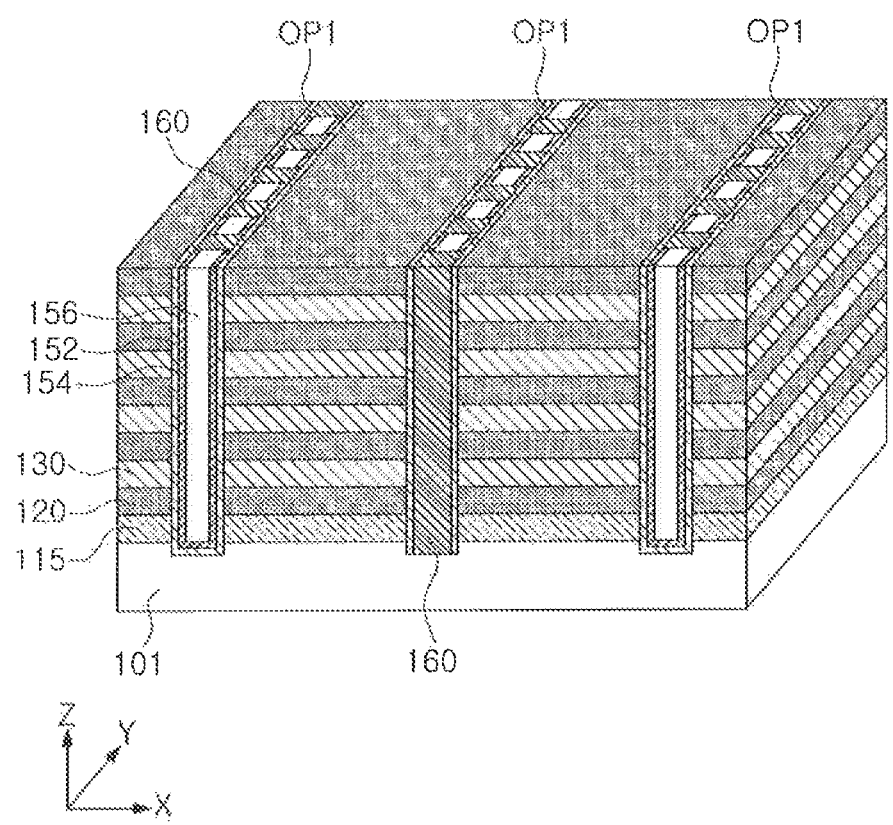
FIGS. 14 to 21 are schematic perspective views illustrating a method of manufacturing a vertical memory device according to an exemplary embodiment.

Referring to FIG. 14, after a sacrificial layer 115 is formed to cover the entire upper surface of a substrate 101, insulating layers 120 and conductive layers 130 may be alternately formed on the sacrificial layer 115. The insulating layers 120, the conductive layers 130 and the sacrificial layer 115 may be anisotropically etched to form first openings OP1 extending in the second direction (the Y direction) parallel to the upper surface of the substrate 101, and a gate insulating layer 152 and a channel layer 154 may be conformally formed on inner walls and bottom surfaces of the first openings OP1. The remaining space of the first openings OP1 may be filled with a gap fill insulating layer 156. Cutting insulating layers 160 may be formed to cut the channel layer 154 and the gap fill insulating layer 156 into cell unit sized portions. The cutting insulating layers 160 may be disposed at a specific interval in the second direction (the Y direction). The channel layer 154 may be divided into a plurality of channel layers 154 spaced apart from each other in the second direction (the Y direction) by the cutting insulating layers 160. The gap fill insulating layer 156 may also be divided into a plurality of gap fill insulating layers 156 spaced apart from each other in the second direction (the Y direction) by the cutting insulating layers 160. The structure illustrated in FIG. 14 may be formed by performing the same or similar processes as those described above with reference to FIGS. 4 to 7. However, in the case of the structure illustrated in FIG. 14, in an exemplary embodiment, a conductive pad layer 158 (see FIG. 7) is not formed.

Figure 15:
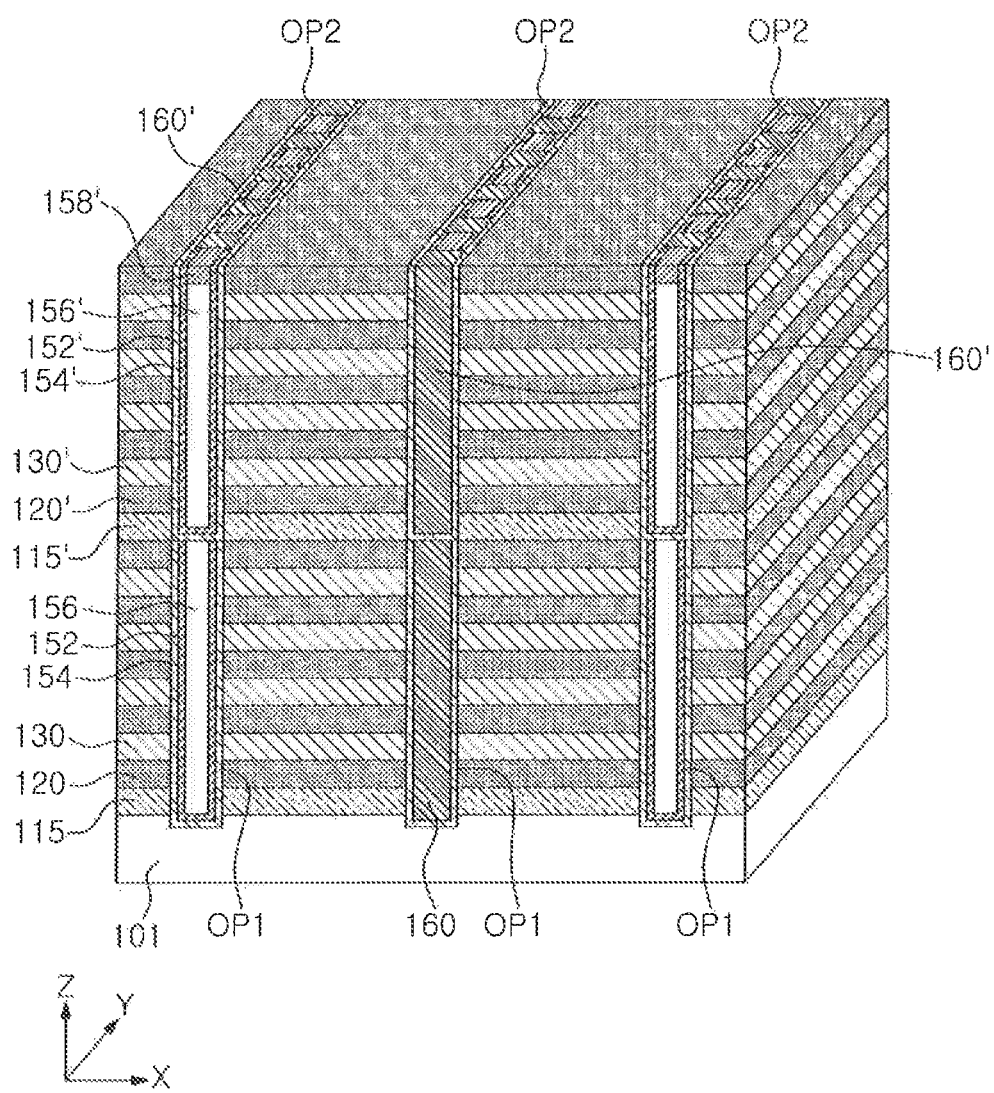

Referring to FIG. 15, after additionally forming a sacrificial layer 115' on the structure illustrated in FIG. 14, insulating layers 120' and conductive layers 130' may be alternately formed on the sacrificial layer 115'. Second openings OP2 may be formed to extend in the second direction (the Y direction) parallel to the upper surface of the substrate 101 by anisotropically etching the insulating layers 120', the conductive layers 130' and the sacrificial layer 115'. The second openings OP2 and the first openings OP1 may be aligned with each other vertically. The gate insulating layer 152' and the channel layer 154' may be conformally formed on inner walls and bottom surfaces of the second openings OP2. Then, the remaining space of the second openings OP2 may be filled with the gap fill insulating layer 156'. After removing a portion of the gap fill insulating layer 156', a conductive pad layer 158' may be formed. Cutting insulating layers 160' may be formed to cut the channel layer 154', the gap fill insulating layer 156' and the conductive pad layer 158' into cell unit sized portions. The cutting insulating layers 160' may be disposed at a specific interval in the second direction (the Y direction). The channel layer 154' may be divided into a plurality of channel layers 154' spaced apart from one another in the second direction (the Y direction) by the cutting insulating layers 160'. The gap fill insulating layer 156' and the conductive pad layer 158' may also be divided into a plurality of gap fill insulating layers 156' and a plurality of conductive pad layers 158' spaced apart from each other in the second direction (the Y direction) by the cutting insulating layers 160'.

Figure 16:
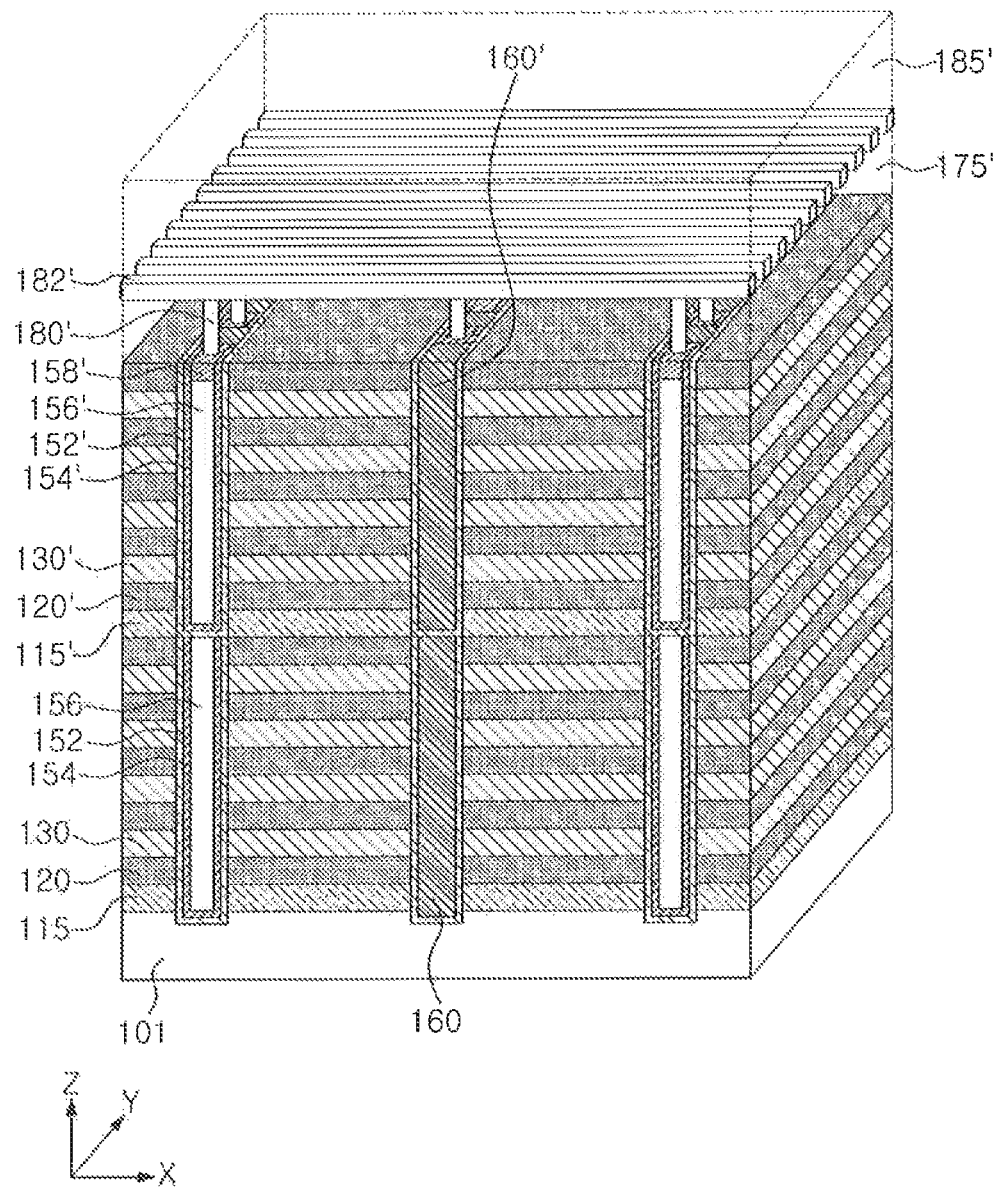

Referring to FIG. 16, after an interlayer insulating layer 175' is formed on the structure illustrated in FIG. 15, vias 180' may be formed to penetrate through the interlayer insulating layer 175' to be electrically connected to the conductive pad layer 158', and bit lines 182' may be formed to be electrically connected to the vias 180'. An interlayer insulating layer 185' may be formed to cover the bit lines 182'.

Figure 17:
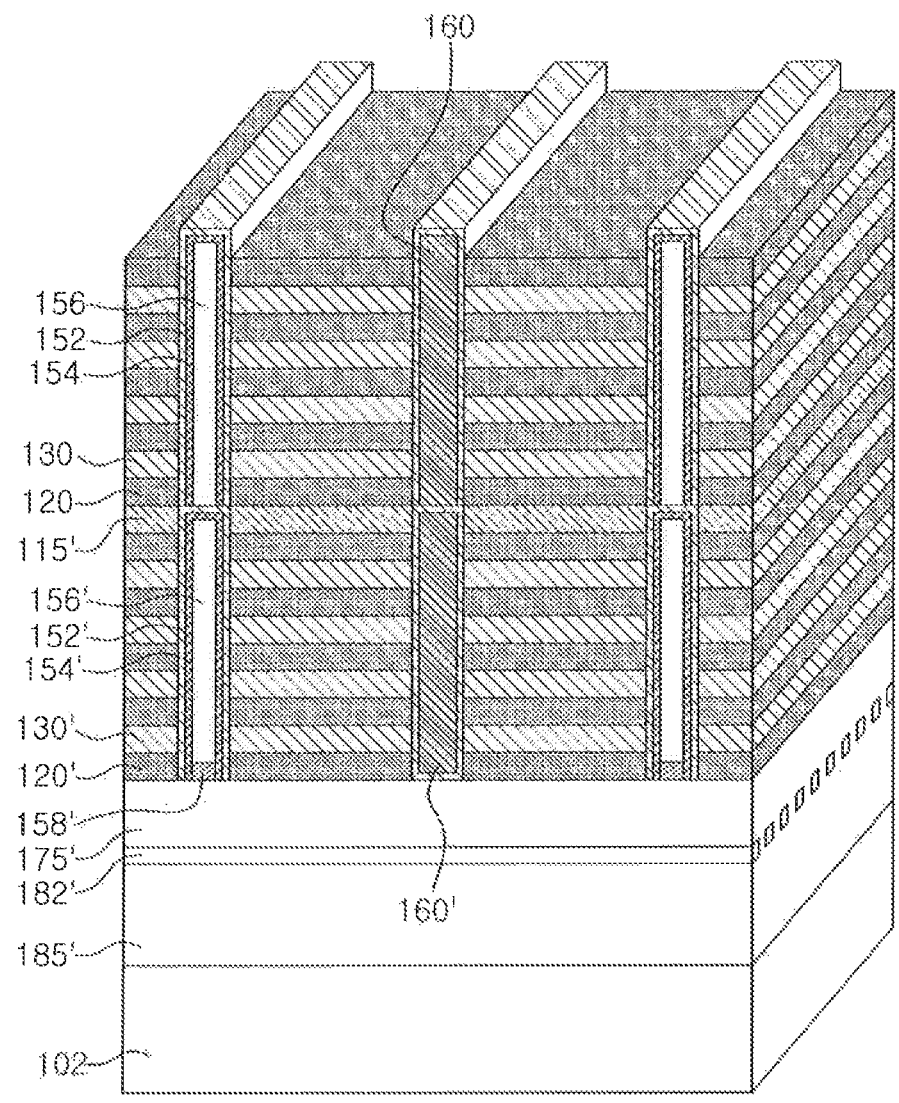

Referring to FIG. 17, after a carrier substrate 102 is attached to the structure illustrated in FIG. 16, the substrate 101 and the sacrificial layer 115 may be removed. A portion of the gate insulating layer 152 may protrude onto the insulating layer 120. Portions of the channel layers 154, portions of the gap fill insulating layers 156, and portions of the cutting insulating layers 160 may also protrude onto the insulating layer 120.

Figure 18:
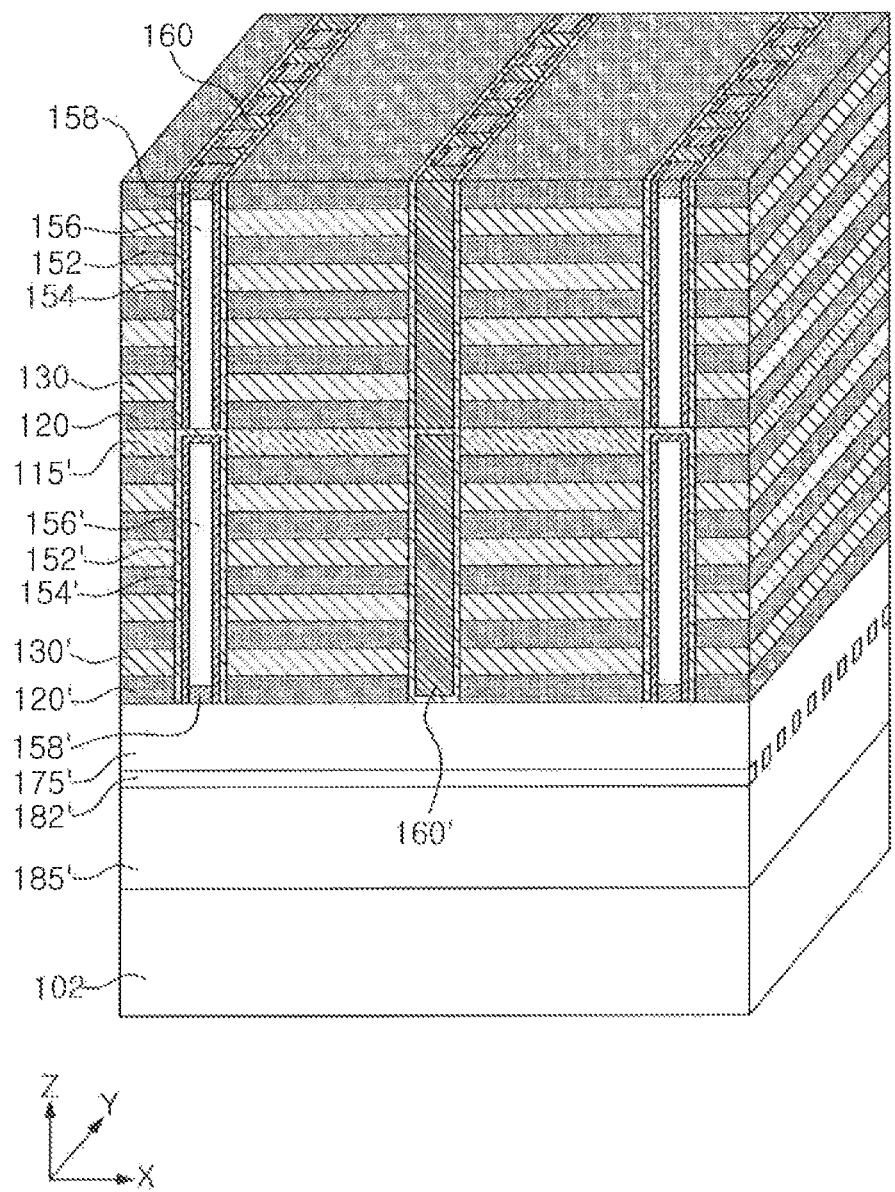

Referring to FIG. 18, a chemical mechanical polishing (CMP) process may be performed to expose the gap fill insulating layers 156. After removing portions of the exposed gap fill insulating layers 156, conductive pad layers 158 may be formed.

Figure 19:
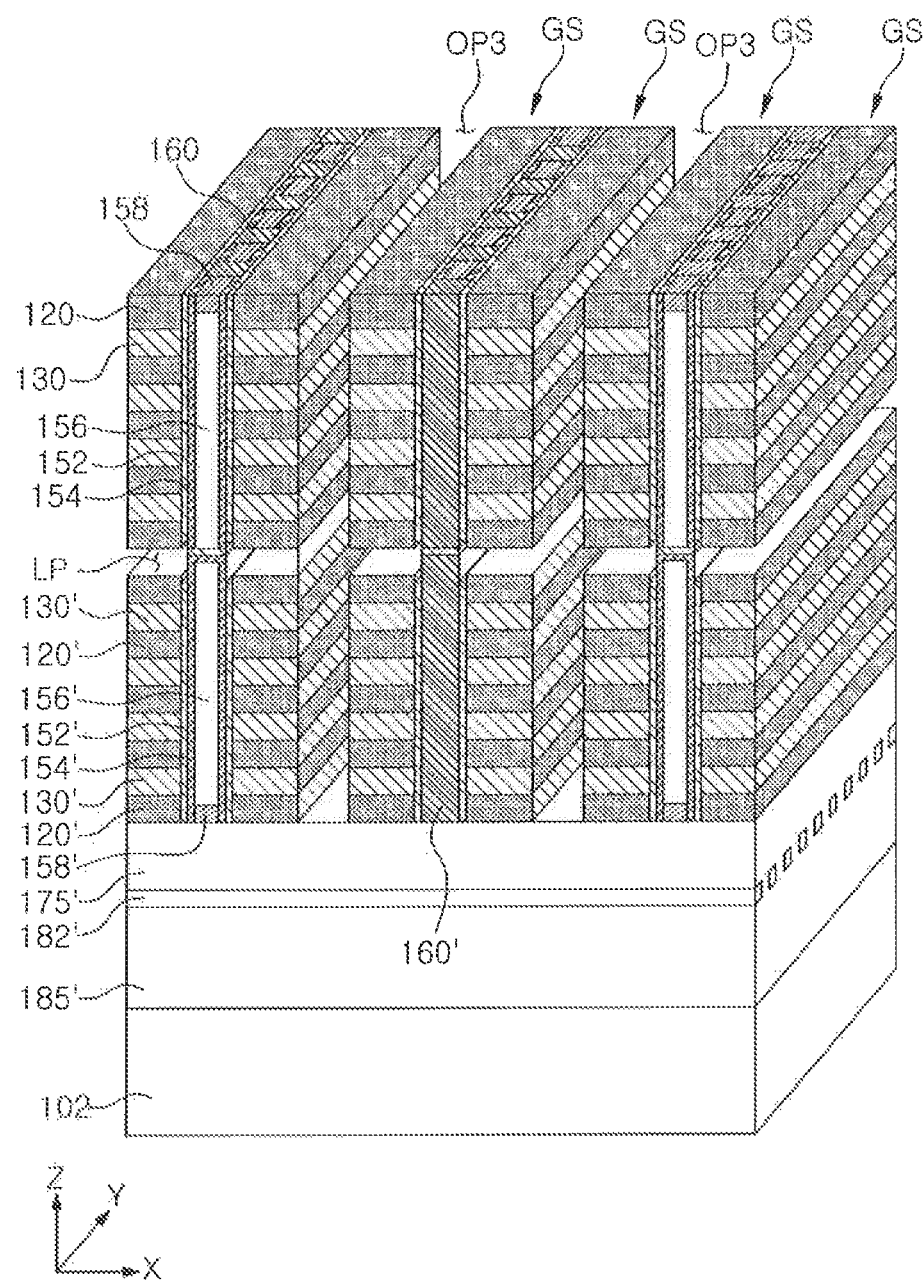

Referring to FIG. 19, by anisotropically etching the insulating layers 120 and 120', the conductive layers 130 and 130', and the sacrificial layer 115' (see FIG. 18), third openings OP3 may be formed to extend in the second direction (the Y direction). The third openings OP3 may be disposed at a specific interval in the first direction (the X direction). The third openings OP3 may be disposed at the same interval as that between the second openings OP2 in the first direction (the X direction). The third openings OP3 may be formed between the second openings OP2. The third openings OP3 may be formed between the channel layers 154 and between the cutting insulating layers 160 in the first direction (the X direction). The sacrificial layer 115' may be exposed by the third openings OP3, and the exposed sacrificial layer 115' may be removed to form a side opening portion LP. Portions of the gate insulating layers 152 and 152' exposed by the side opening portion LP may be removed.

Figure 20:
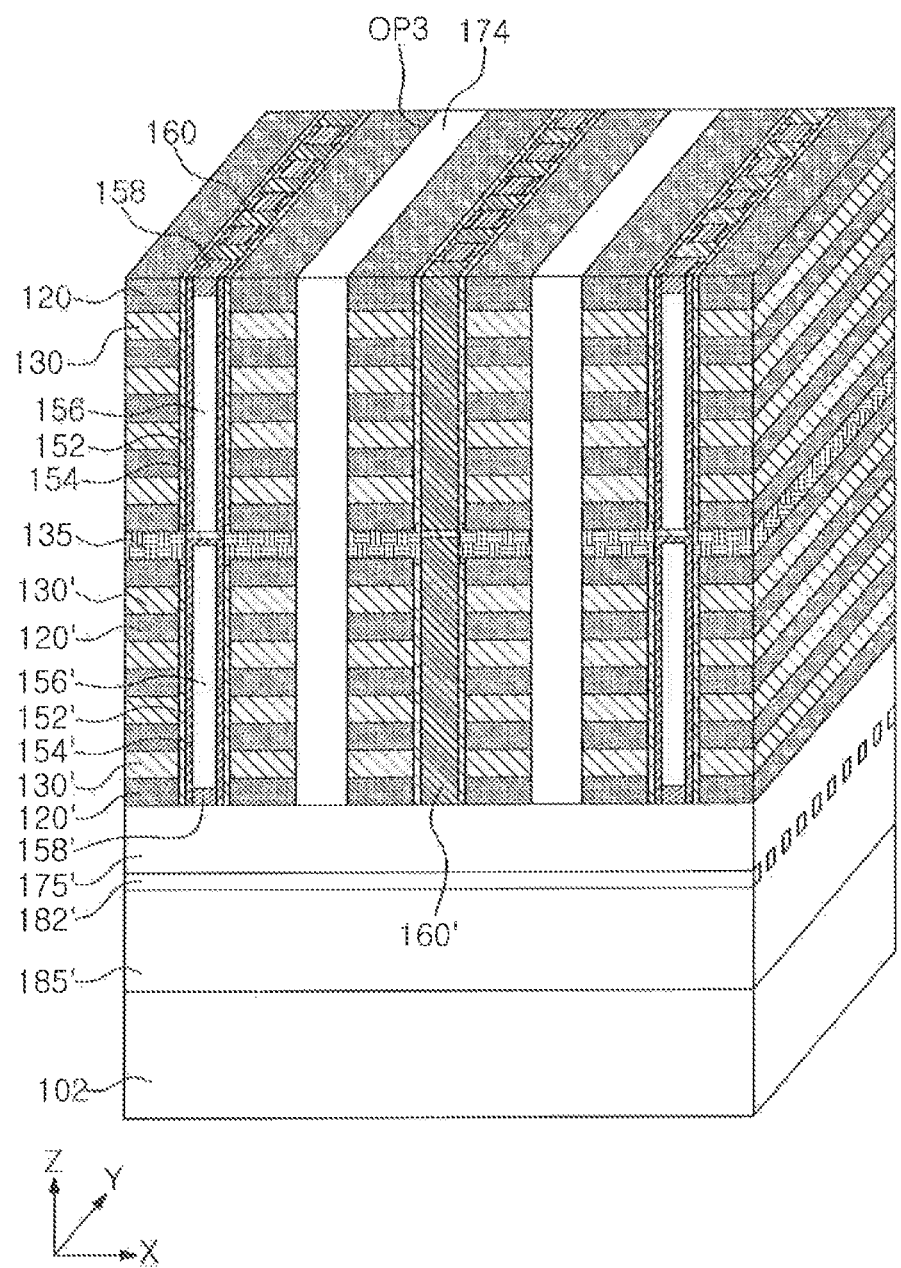

Referring to FIG. 20, conductive layers 135 may be formed in the side opening portion LP, and insulating layers 174 may be formed to fill the third openings OP3. The conductive layers 135 may contact the gate insulating layers 152 and 152' and the channel layers 154 and 154'.

Figure 21:
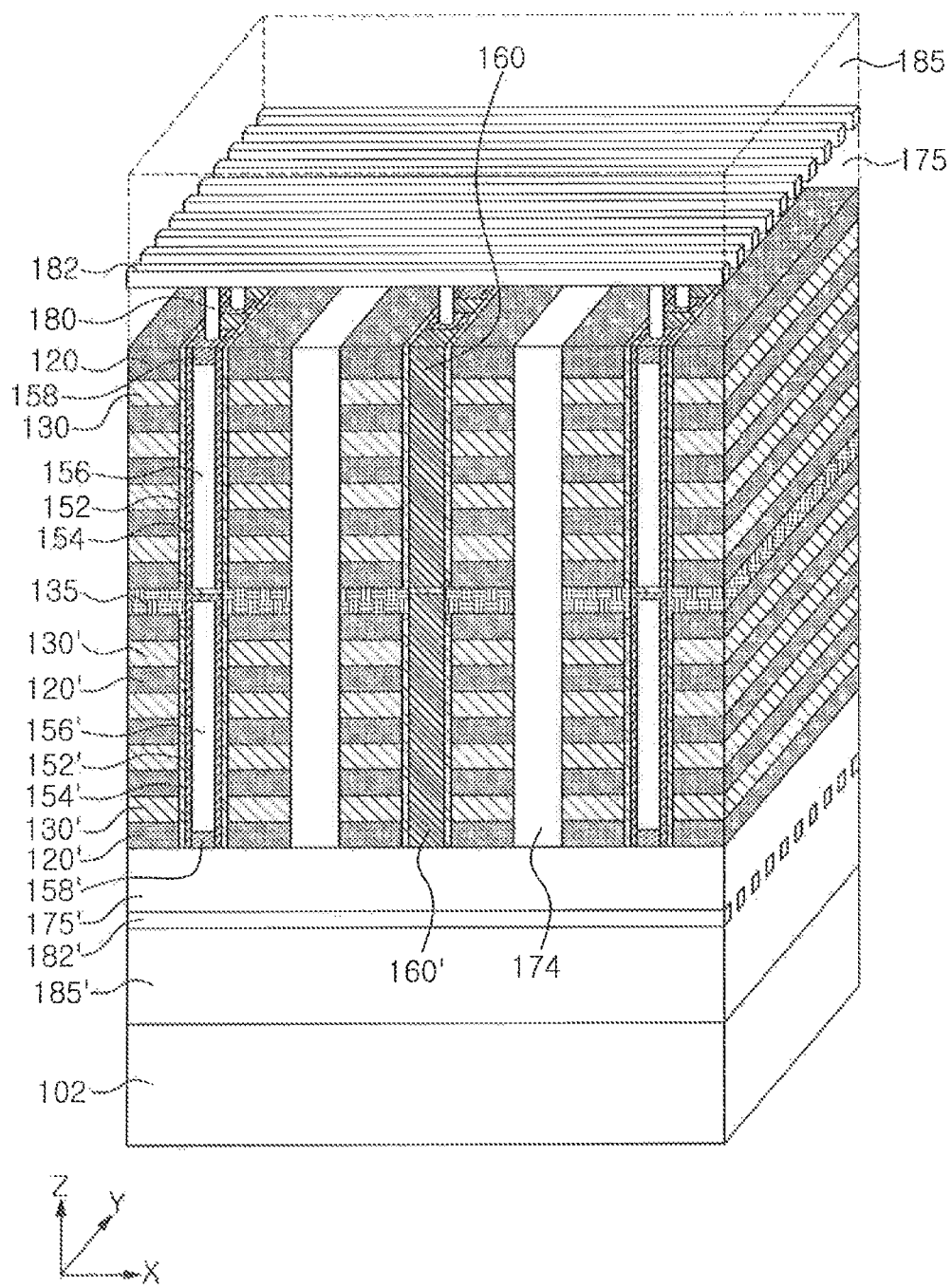

Referring to FIG. 21, after an interlayer insulating layer 175 is formed on the structure illustrated in FIG. 20, vias 180 may be formed to penetrate through the interlayer insulating layer 175 to be electrically connected to the conductive pad layer 158, and bit lines 182 may be formed to be electrically connected to the vias 180. An interlayer insulating layer 185 may be formed to cover the bit lines 182.

Referring again to FIG. 13, after the carrier substrate 102 is removed, a peripheral circuit structure S3 providing a peripheral circuit may be bonded. The peripheral circuit structure S3 may include the base substrate 11, the transistors 20, the circuit wirings 50, and the interlayer insulating layer 30.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As set forth above, according to an exemplary embodiment, a vertical memory device having improved integration and excellent electrical characteristics may be provided.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A vertical memory device, comprising:
a stacked structure comprising a plurality of gate electrode layers including a polycrystalline silicon stacked on a substrate;
a plurality of channel layers extending in a direction perpendicular to an upper surface of the substrate on a first side surface of the stacked structure, and spaced apart from each other in a direction parallel to the upper surface of the substrate;
a common source layer disposed between the stacked structure and the substrate and contacting a portion of sidewalls of the channel layers;

a gate insulating layer disposed between the stacked structure and the channel layers and covering at least a portion of the first side surface of the stacked structure;

a plurality of cutting insulating layers disposed alternately with the channel layers on the first side surface of the stacked structure; and a separation pattern disposed on a second side surface of the stacked structure, wherein the second side surface opposes the first side surface, and wherein the common source layer penetrates through the gate insulating layer and contacts the channel layers.

2. The vertical memory device of claim 1, wherein the gate insulating layer is disposed between the channel layers and the substrate, and wherein the channel layers and the substrate are electrically connected by the common source layer.

3. The vertical memory device of claim 1,
wherein the separation pattern comprises an insulating layer.

4. The vertical memory device of claim 1, wherein the common source layer comprises a first portion in contact with lower ends of the channel layers, and second portions intersecting the first portion.

5. The vertical memory device of claim 1, wherein the common source layer comprises p-type polycrystalline silicon.

6. The vertical memory device of claim 1, wherein the gate electrode layers comprise p-type polycrystalline silicon, and the common source layer comprises n-type polycrystalline silicon.

7. A vertical memory device, comprising:
a plurality of separation patterns disposed on a substrate and spaced apart from each other, wherein the separation patterns extend in a first direction parallel to an upper surface of the substrate;

a first stacked structure and a second stacked structure below the first stacked structure, disposed between the separation patterns and extending in the first direction, wherein the first stacked structure and the second stacked structure each comprise a plurality of gate electrode layers;

a plurality of first channel layers disposed on a side surface of the first stacked structure;

a plurality of second channel layers disposed on a side surface of the second stacked structure and facing the first channel layers;

a common source layer disposed between the substrate and at least one of the first stacked structure and the second stacked structure, and electrically connected to the first channel layers and the second channel layers;

a plurality of gap fill insulating layers disposed between the first channel layers and the second channel layers; and a plurality of cutting insulating layers alternately disposed with the gap fill insulating layers in the first direction, and disposed between the first stacked structure and the second stacked structure, wherein the cutting insulating layers are in contact with the common source layer, the first channel layers and the second channel layers, and wherein the separation patterns penetrate through the common source layer.

8. The vertical memory device of claim 7, wherein the common source layer comprises a first common source layer disposed between the first stacked structure and the substrate, and a second common source layer disposed between the second stacked structure and the substrate.

9. The vertical memory device of claim 8, further comprising:
a plurality of gate insulating layers disposed between the first stacked structure and the first channel layers, and disposed between the second stacked structure and the second channel layers, wherein the first common source layer and the second common source layer penetrate through the gate insulating layers and contact the first channel layers and the second channel layers, respectively.

10. The vertical memory device of claim 7, wherein the gate electrode layers and the common source layer comprise p-type polycrystalline silicon.

11. The vertical memory device of claim 7, wherein the gate electrode layers comprise p-type polycrystalline silicon, and the common source layer comprises n-type polycrystalline silicon.

12. A vertical memory device, comprising:
a stacked structure stacked on a substrate and comprising a plurality of conductive layers disposed above an upper surface of the substrate and extending in a direction parallel to the upper surface of the substrate; and a plurality of channel layers extending in a direction perpendicular to the upper surface of the substrate, disposed on a side surface of the stacked structure, and spaced apart from each other; and a gate insulating layer disposed between the stacked structure and the plurality of channel layers and covering at least a portion of the first side surface of the stacked structure, wherein the plurality of conductive layers comprises a first conductive layer insulated from the channel layers and a second conductive layer in contact with the channel layers, wherein the second conductive layer comprises a first portion in contact with lower ends of the channel layers and a plurality of second portions intersecting the first portion.

13. The vertical memory device of claim 12, wherein the plurality of conductive layers further comprises an intermediate conductive layer, wherein the first conductive layer includes a plurality of upper conductive layers disposed on the intermediate conductive layer and a plurality of lower conductive layers disposed below the intermediate conductive layer, wherein the stacked structure comprises an upper stacked structure comprising the upper conductive layers, and a lower stacked structure comprising the lower conductive layers, wherein the channel layers comprise a plurality of upper channel layers disposed on a side surface of the upper stacked structure and a plurality of lower channel layers disposed on a side surface of the lower stacked structure, and wherein lower portions of the upper channel layers and upper portions of the lower channel layers contact the intermediate conductive layer.

* * * * *